US012261929B2

(12) United States Patent
Ochiai

(10) Patent No.: US 12,261,929 B2
(45) Date of Patent: Mar. 25, 2025

(54) TRANSMISSION DEVICE AND ELECTRONIC APPARATUS

(71) Applicant: Sony Semiconductor Solutions Corporation, Kanagawa (JP)

(72) Inventor: Yasuhiro Ochiai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 20 days.

(21) Appl. No.: 18/255,918

(22) PCT Filed: Nov. 16, 2021

(86) PCT No.: PCT/JP2021/042125
§ 371 (c)(1),
(2) Date: Jun. 5, 2023

(87) PCT Pub. No.: WO2022/130880
PCT Pub. Date: Jun. 23, 2022

(65) Prior Publication Data
US 2024/0031122 A1 Jan. 25, 2024

(30) Foreign Application Priority Data
Dec. 17, 2020 (JP) .................................. 2020-209036

(51) Int. Cl.
*H04L 7/00* (2006.01)
(52) U.S. Cl.
CPC .......... *H04L 7/0025* (2013.01); *H04L 7/0054* (2013.01)
(58) Field of Classification Search
CPC . H04L 7/0025; H04L 7/0054; H04L 25/0276; H03K 19/018507
See application file for complete search history.

(56) References Cited

U.S. PATENT DOCUMENTS 8,401,098 B2 * 3/2013 Bae ..................... H04L 25/085
327/175
2009/0230947 A1 * 9/2009 Sumita .................... H03K 5/12
327/160

FOREIGN PATENT DOCUMENTS

| JP | H11026593 A | 1/1999 |
| WO | 2015146511 A1 | 10/2015 |
| WO | 2017149980 A1 | 9/2017 |

OTHER PUBLICATIONS

Machine translation of TW-201729548-A (Year: 2017).*

(Continued)

*Primary Examiner* — Jean B Corrielus
(74) *Attorney, Agent, or Firm* — Michael Best & Friedrich LLP

(57) ABSTRACT

A transmission device according to the present disclosure includes: a driver circuit that includes a plurality of output circuits each including a plurality of transistors, and outputs a plurality of output signals from the plurality of output circuits on a basis of a plurality of driver input signals being respectively inputted to the plurality of transistors, the plurality of output signals configuring a differential signal and having signal levels that are different from each other; a plurality of timing adjustment circuits that each adjusts, on a basis of a timing setting signal, an input timing of corresponding one of the plurality of driver input signals to the driver circuit; and a control circuit that changes a set value of the timing setting signal for each of the plurality of timing adjustment circuits to a value corresponding to a plurality of transition states of possible signal levels of each of the plurality of output signals to be outputted from the driver circuit.

10 Claims, 34 Drawing Sheets

(56) References Cited

OTHER PUBLICATIONS

Machine translation of JP-4063392-B2 (Year: 2008).*
International Search Report (PCT/ISA/210), International Application No. PCT/JP2021/042125, dated Feb. 15, 2022.

* cited by examiner

[FIG.1]

COMPARATIVE EXAMPLE

[FIG. 4]

COMPARATIVE EXAMPLE

[FIG.5]

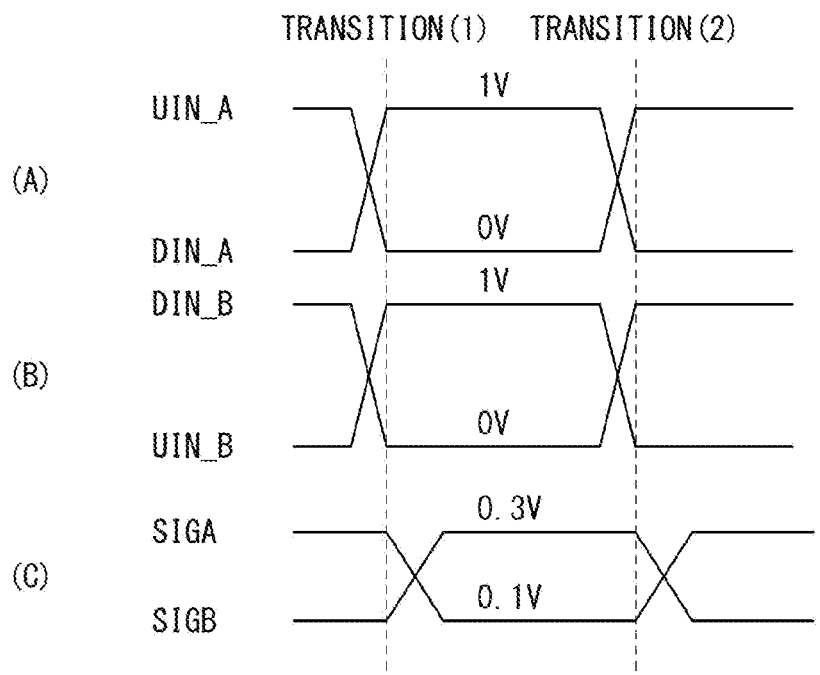

[FIG. 9]
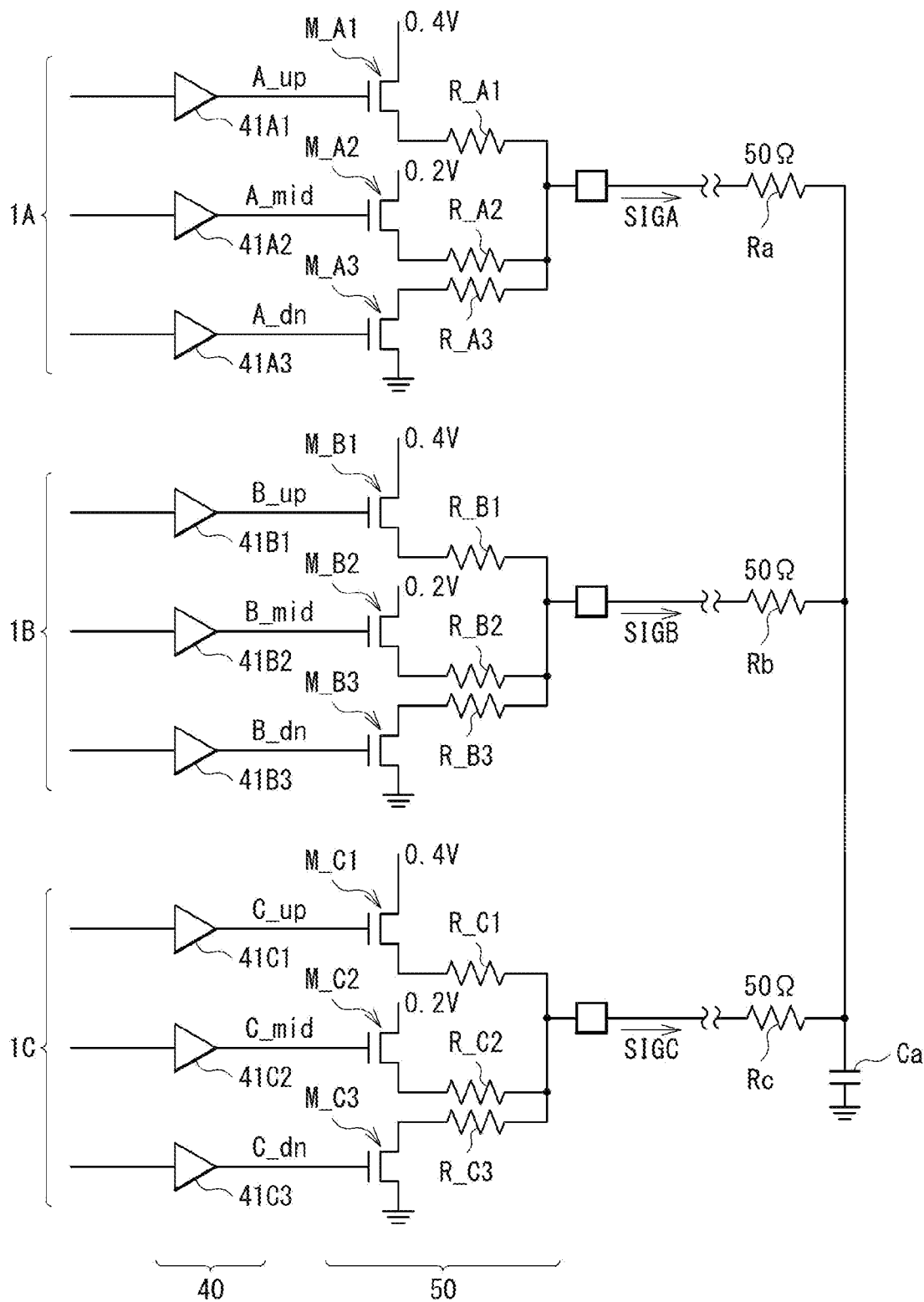

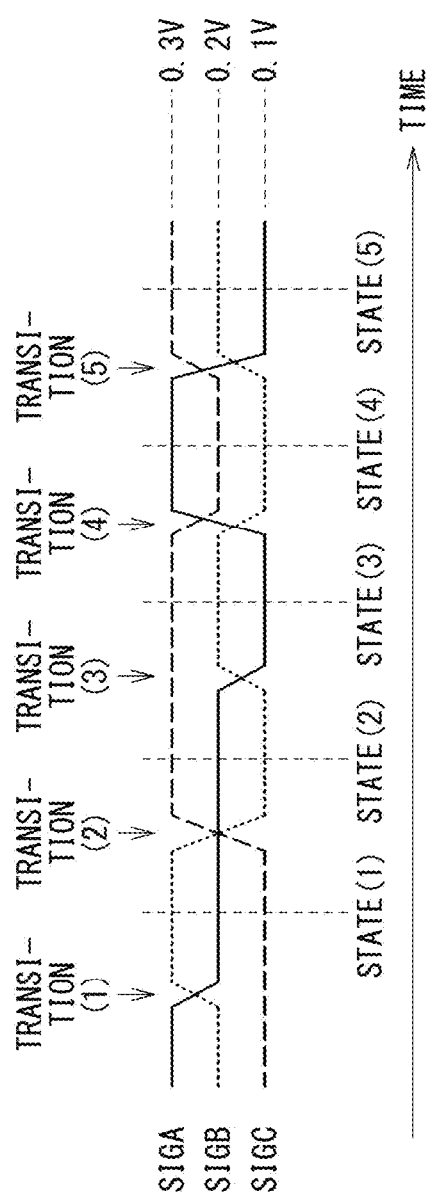

[FIG. 11]

| DIFFE-RENTIAL SIGNAL | DIFFERENTIAL SIGNAL LEVEL (V) | | | | |
|---|---|---|---|---|---|
| | STATE(1) | STATE(2) | STATE(3) | STATE(4) | STATE(5) |
| SIGA-SIGB | -0.1 | 0.1 | -0.1 | 0.2 | -0.1 |
| SIGB-SIGC | 0.2 | -0.2 | 0.1 | -0.1 | -0.1 |
| SIGC-SIGA | -0.1 | 0.1 | 0.2 | -0.1 | 0.2 |

[FIG. 12]
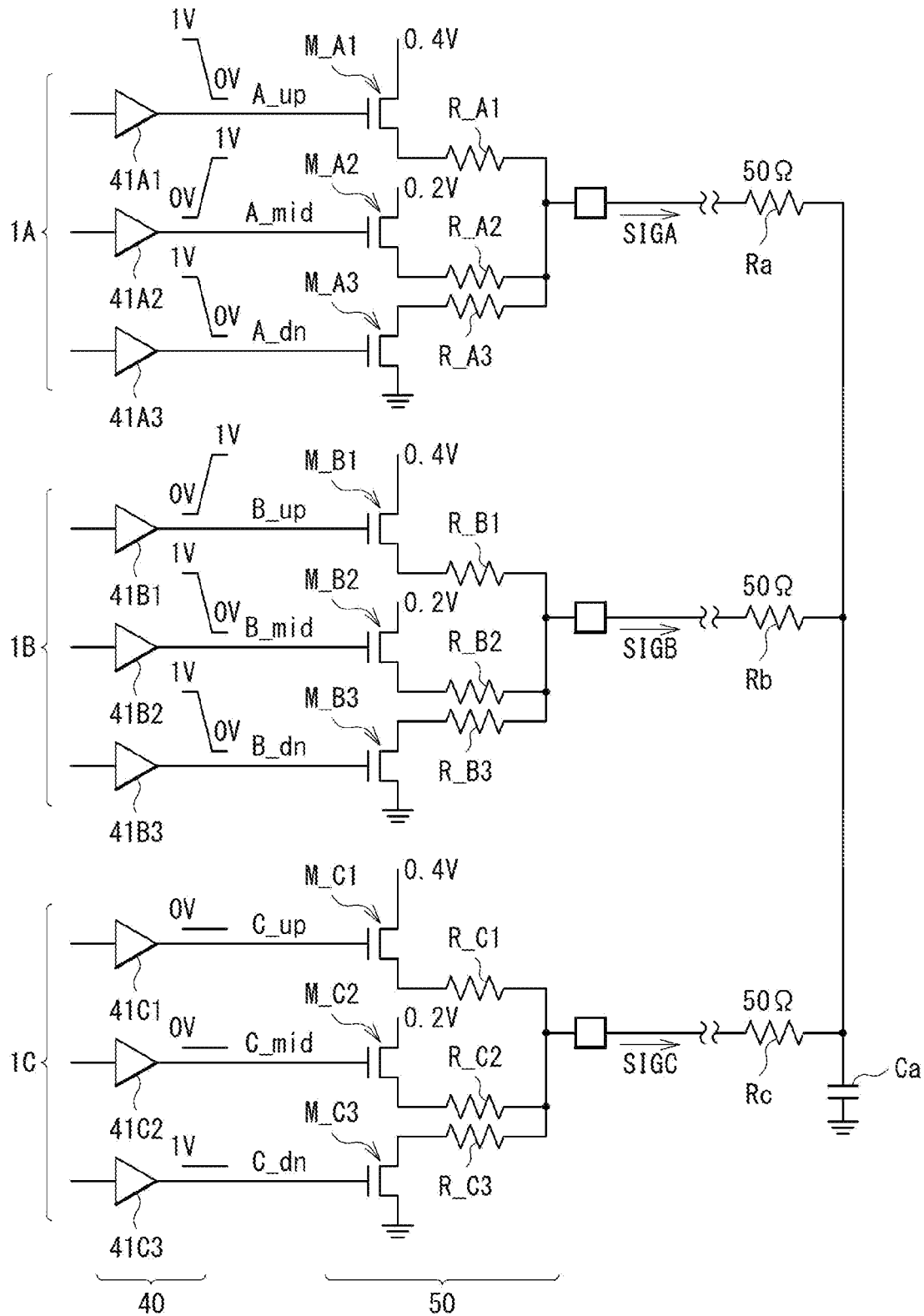

FIG. 13

| | Vgs AND Vds OF M_* IN ON STATE | | |
|---|---|---|---|
| | SIGA | SIGB | SIGC |
| TRANSITION (1) | M_A2: Vgs=0.8V, Vds=0.1V | M_B1: Vgs=0.8V, Vds=0.2V | — |
| TRANSITION (2) | — | M_B3: Vgs=1.0V, Vds=0.3V | M_C1: Vgs=0.9V, Vds=0.3V |
| TRANSITION (3) | M_A3: Vgs=1.0V, Vds=0.2V | M_B2: Vgs=0.9V, Vds=0.1V | — |
| TRANSITION (4) | M_A1: Vgs=0.9V, Vds=0.3V | M_B3: Vgs=1.0V, Vds=0.2V | M_C2: Vgs=0.8V, Vds=0.2V |
| TRANSITION (5) | M_A3: Vgs=1.0V, Vds=0.3V | M_B2: Vgs=0.9V, Vds=0.1V | M_C1: Vgs=0.8V, Vds=0.2V |

[ FIG. 18 ]
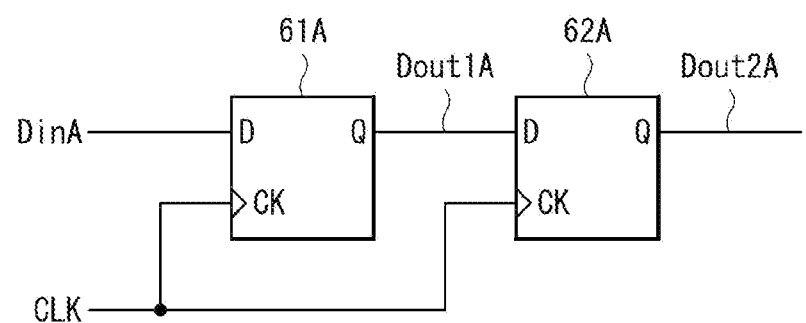
[ FIG. 19 ]
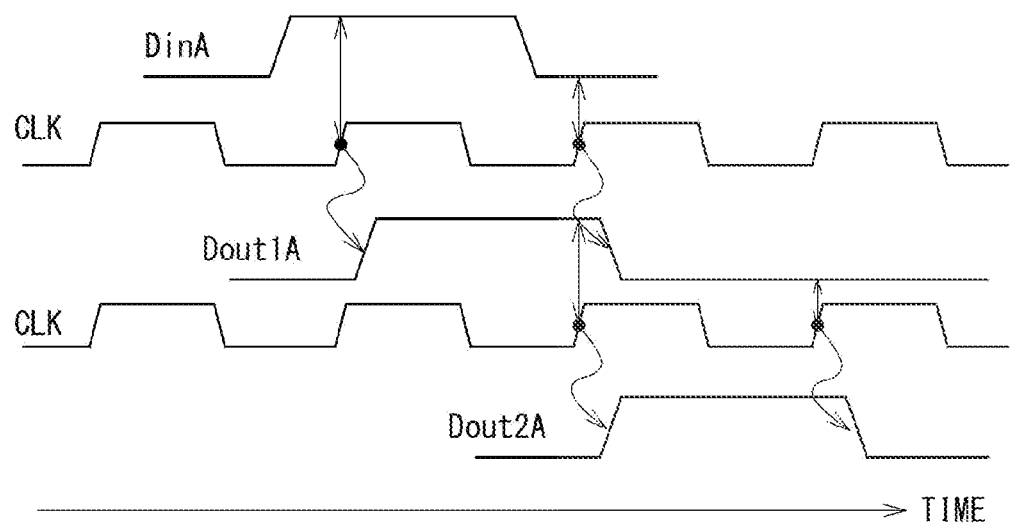

[ FIG. 23 ]

[ FIG. 29 ]
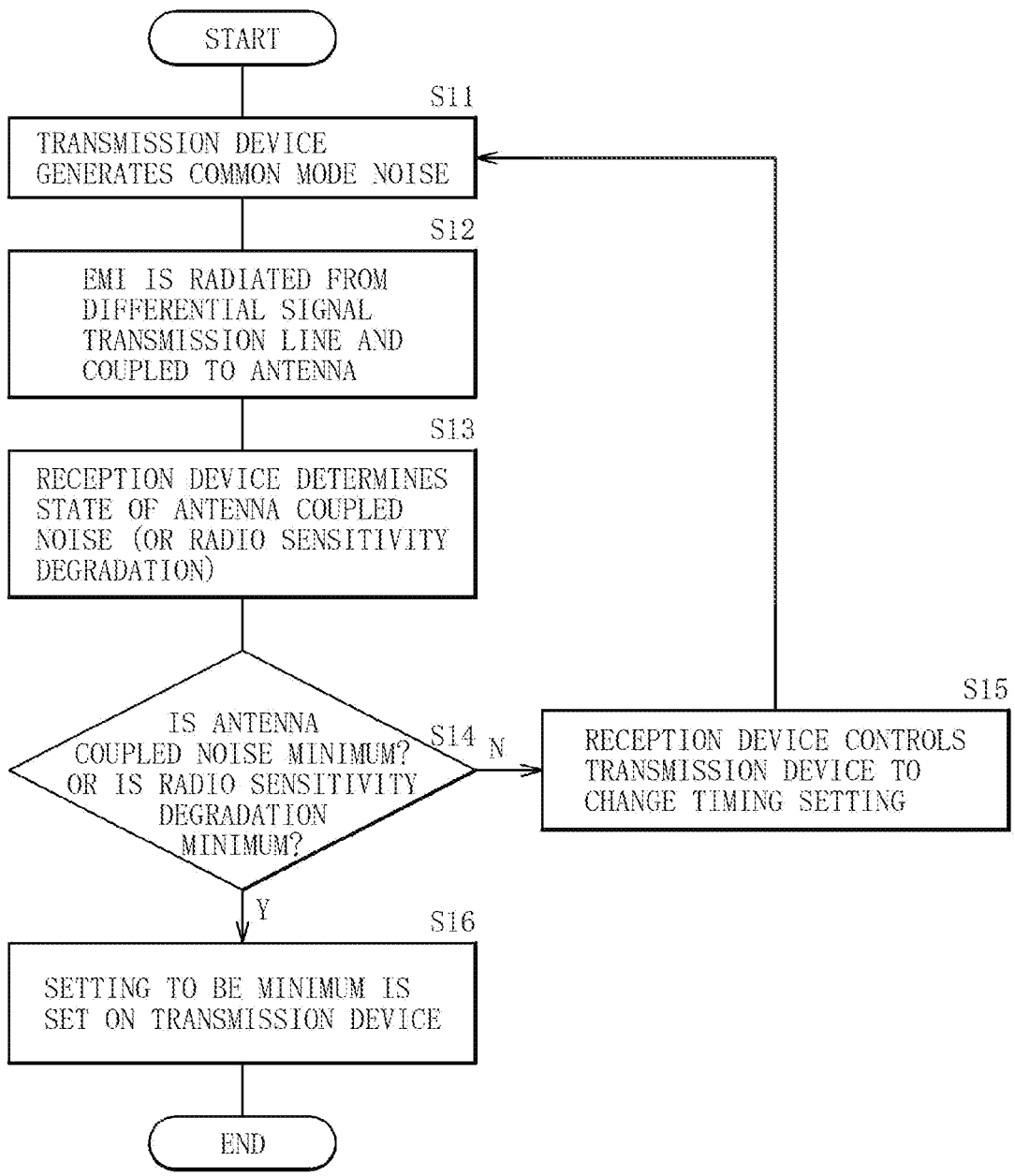

[ FIG. 30 ]
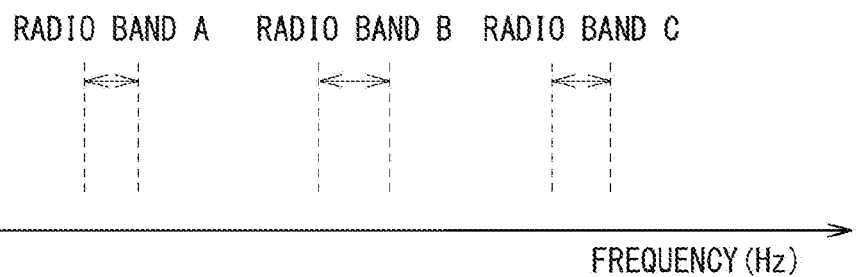
[ FIG. 31 ]
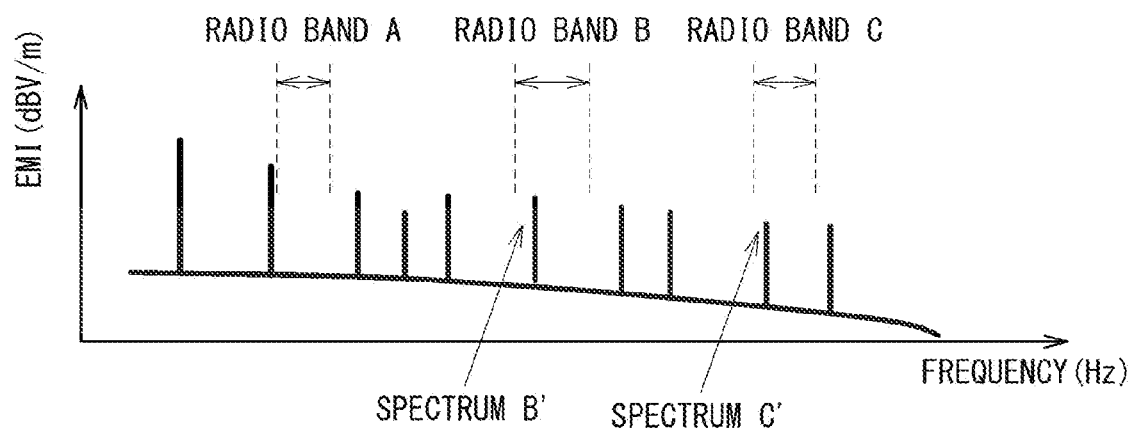
[ FIG. 32 ]
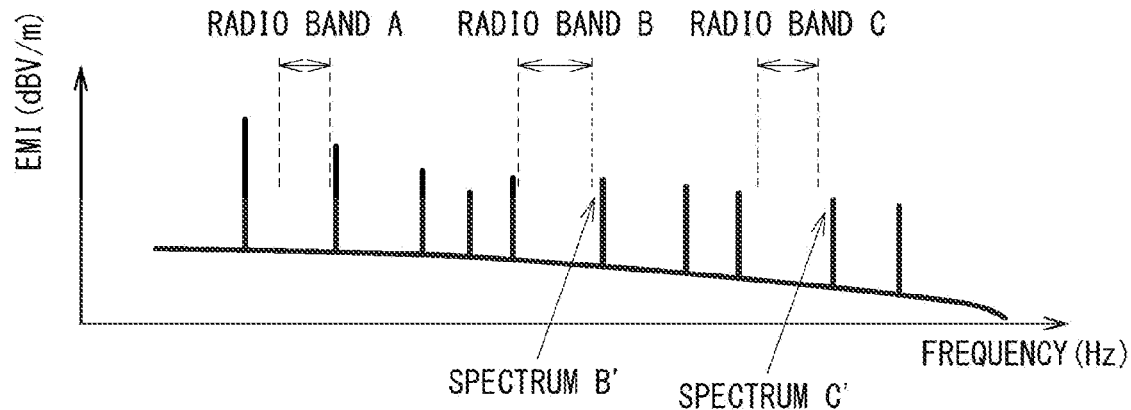

[ FIG. 33 ]

| FREQUENCY SETTING | SCALE FACTOR WITH RESPECT TO BASIC OPERATION FREQUENCY ||
|---|---|---|
| | CIRCUIT BLOCK A | CIRCUIT BLOCK B |
| 1 | 0.8 | 0.8 |
| 2 | 0.8 | 0.9 |
| 3 | 0.8 | 1.0 |
| 4 | 0.8 | 1.1 |
| 5 | 0.8 | 1.2 |
| ⋮ | ⋮ | ⋮ |
| 21 | 1.2 | 0.8 |
| 22 | 1.2 | 0.9 |
| 23 | 1.2 | 1.0 |
| 24 | 1.2 | 1.1 |
| 25 | 1.2 | 1.2 |

FREQUENCY SETTING IN WHICH RADIO CHARACTERISTIC IS MOST APPROPRIATE

[ FIG.34 ]
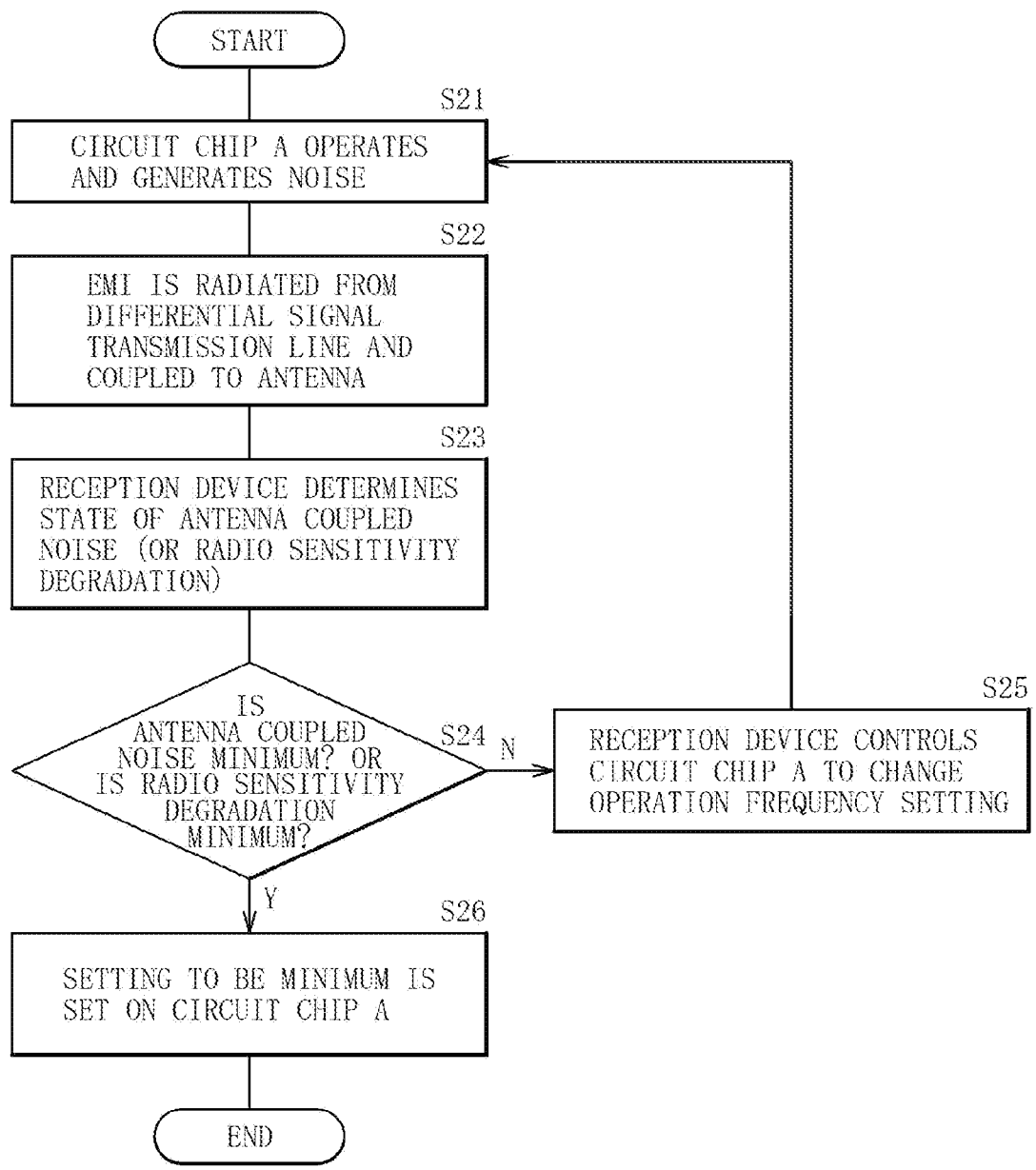

[ FIG. 35 ]
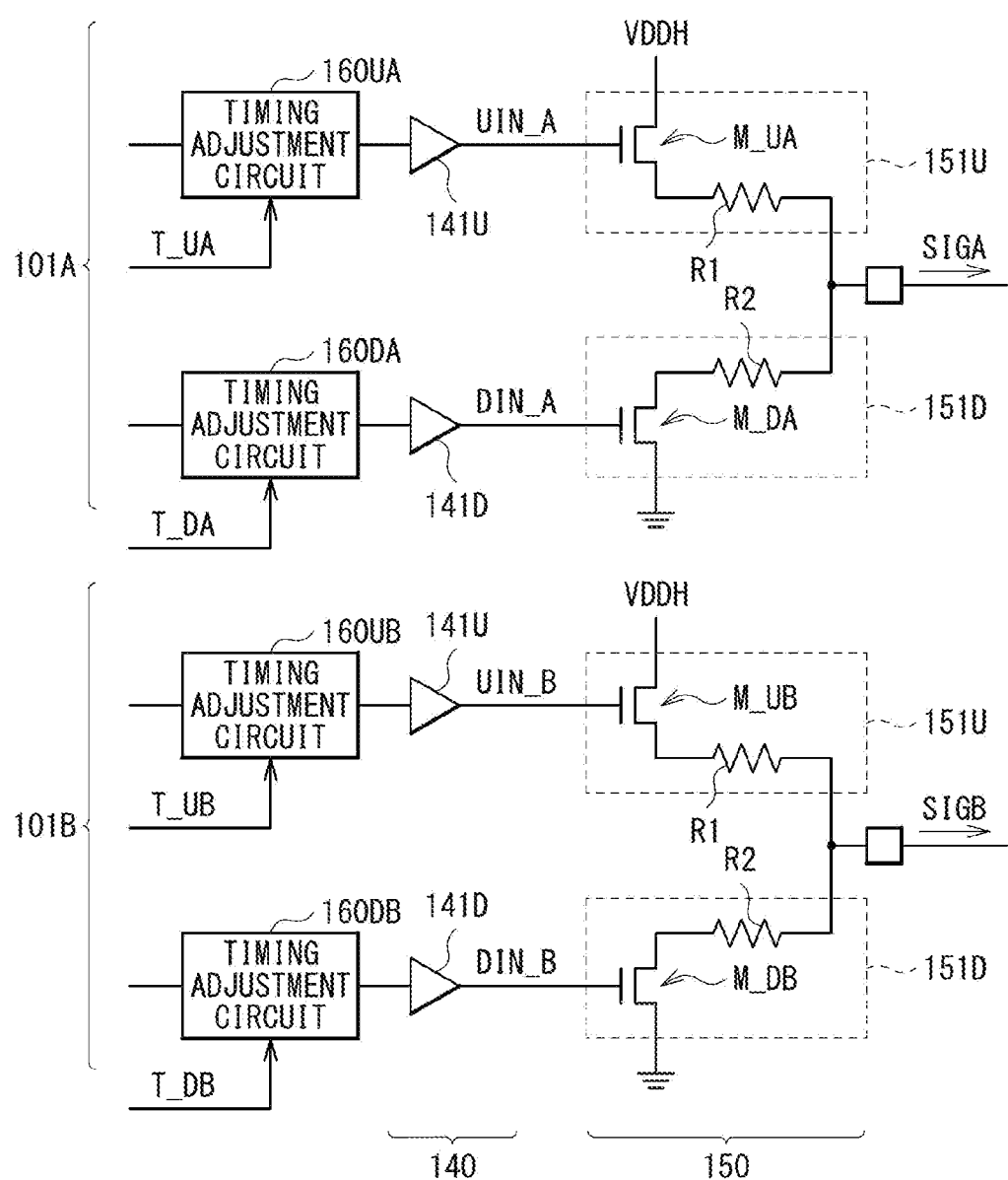

[FIG. 36]
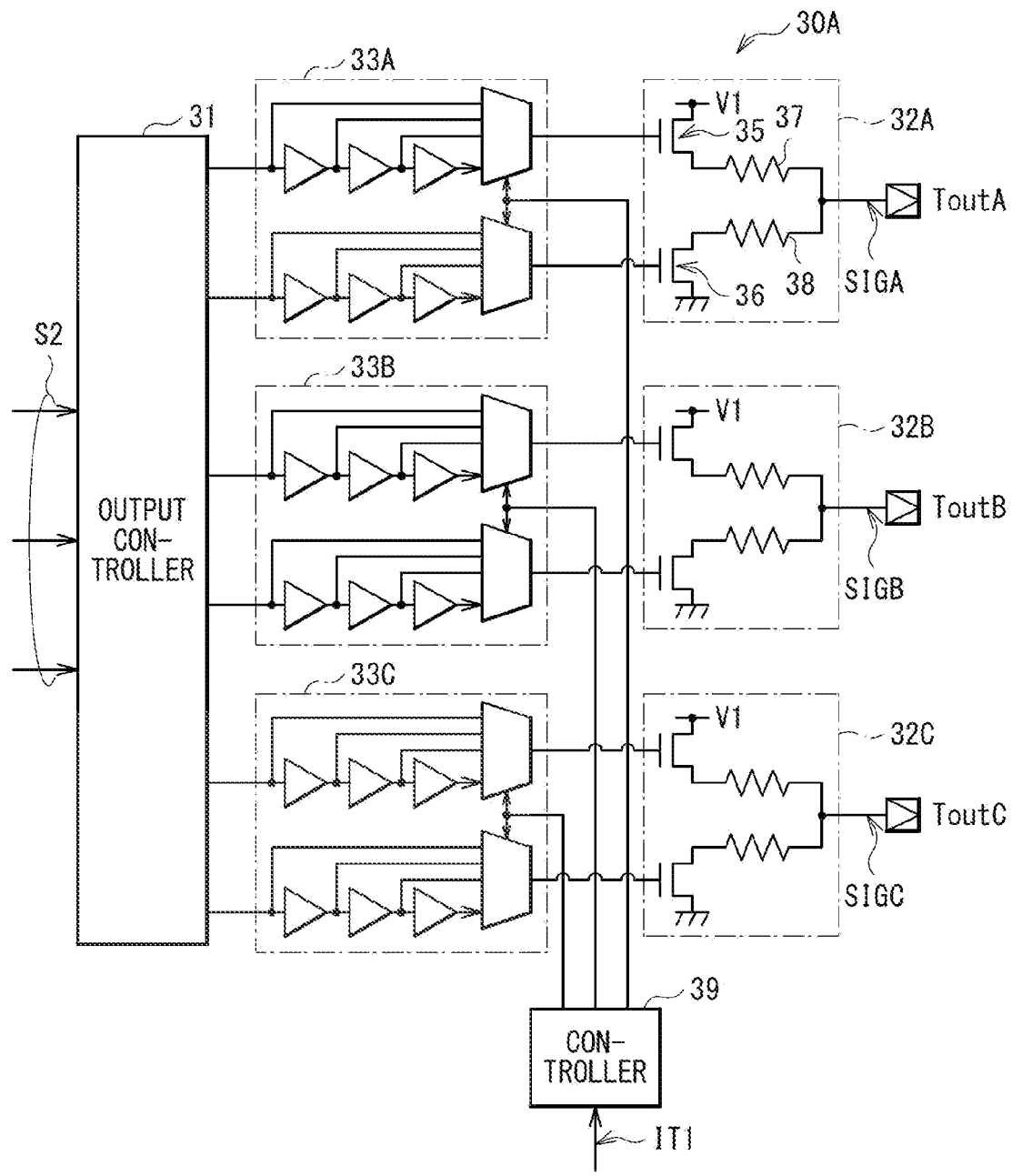

[ FIG. 37 ]
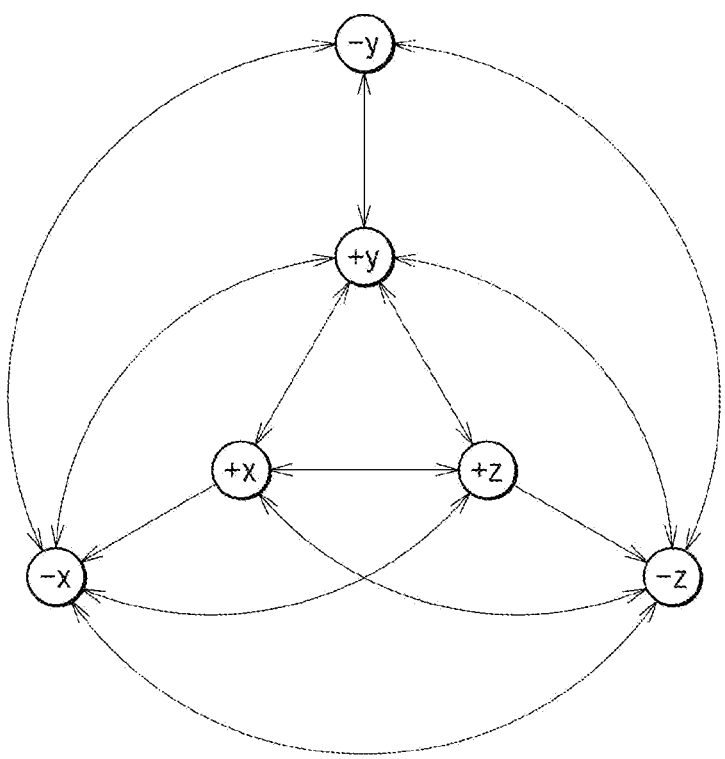

TRANSMISSION DEVICE AND ELECTRONIC APPARATUS

CROSS REFERENCE TO RELATED APPLICATIONS

This application is a 371 of PCT/JP2021/042125, filed on Nov. 16, 2021, which claims the benefit of Japanese Priority Patent Application JP2020-209036, filed with the Japan Patent Office on Dec. 17, 2020, the entire contents of which are incorporated herein by reference.

TECHNICAL FIELD

The present disclosure relates to a transmission device and an electronic apparatus each of which transmit a differential signal.

BACKGROUND ART

In a case where a transmission device uses a plurality of transmission lines to transmit a differential signal having a differential signal level of two or more values, common mode noise occurs due to imbalance in signals between the respective transmission lines. In order to suppress this, there is a technique of using a timing adjustment circuit to adjust a timing of a driver input signal to a driver circuit of a differential signal in a transmission device (see PTL 1). In this case, a set value of the timing adjustment is constant (fixed).

CITATION LIST

Patent Literature

PTL 1: Japanese Unexamined Patent Application Publication No. H11-26593

SUMMARY OF THE INVENTION

In a case where a set value of timing adjustment is fixed, for example, when a differential signal having a differential signal level of four or more values is to be transmitted, the number of transition states of the differential signal level that the differential signal may take increase, and it becomes difficult to suppress common mode noise in all the transition states.

It is desirable to provide a transmission device and an electronic apparatus that make it possible to improve communication performance.

A transmission device according to an embodiment of the present disclosure includes: a driver circuit that includes a plurality of output circuits each including a plurality of transistors, and outputs a plurality of output signals from the plurality of output circuits on a basis of a plurality of driver input signals being respectively inputted to the plurality of transistors, the plurality of output signals configuring a differential signal and having signal levels that are different from each other; a plurality of timing adjustment circuits that each adjusts, on a basis of a timing setting signal, an input timing of corresponding one of the plurality of driver input signals to the driver circuit; and a control circuit that changes a set value of the timing setting signal for each of the plurality of timing adjustment circuits to a value corresponding to a plurality of transition states of possible signal levels of each of the plurality of output signals to be outputted from the driver circuit.

An electronic apparatus according to an embodiment of the present disclosure includes: a transmission device that transmits a differential signal; and a reception device that receives the differential signal transmitted from the transmission device. The transmission device includes a driver circuit that includes a plurality of output circuits each including a plurality of transistors, and outputs a plurality of output signals from the plurality of output circuits on a basis of a plurality of driver input signals being respectively inputted to the plurality of transistors, the plurality of output signals configuring the differential signal and having signal levels that are different from each other, a plurality of timing adjustment circuits that each adjusts, on a basis of a timing setting signal, an input timing of corresponding one of the plurality of driver input signals to the driver circuit, and a control circuit that changes a set value of the timing setting signal for each of the plurality of timing adjustment circuits to a value corresponding to a plurality of transition states of possible signal levels of each of the plurality of output signals to be outputted from the driver circuit.

The transmission device or the electronic apparatus according to the embodiment of the present disclosure changes the set values of the timing setting signals for the respective plurality of timing adjustment circuits to the values corresponding to the plurality of transition states of the possible signal levels of each of the plurality of output signals to be outputted from the driver circuit.

BRIEF DESCRIPTION OF DRAWINGS

FIG. 7 is a timing chart illustrating an example of operation timings of the plurality of input/output signals in a driver circuit illustrated in FIG. 6

FIG. 8 is an explanatory diagram illustrating an example of a gate-source voltage Vgs and a drain-source voltage Vds of each of MOS transistors that are in an on state in the driver circuit, in each transition state illustrated in FIG. 7.

FIG. 9 is a circuit diagram illustrating a configuration example of a transmission device according to the comparative example that outputs a four-valued differential signal.

FIG. 10 is a timing chart illustrating an example of operation timings of a plurality of output signals to be outputted from a driver circuit of the transmission device according to the comparative example illustrated in FIG. 9.

FIG. 11 is an explanatory diagram illustrating an example of differential signal levels of differential signals to be outputted from the transmission device according to the comparative example illustrated in FIG. 9.

FIG. 12 is a circuit diagram illustrating an example of transition states of signal levels of driver input signals in the transmission device according to the comparative example illustrated in FIG. 9.

FIG. 13 is an explanatory diagram illustrating an example of a gate-source voltage Vgs and a drain-source voltage Vds of each of MOS transistors in an on state in the driver circuit, in each transition state illustrated in FIG. 10.

FIG. 18 is a circuit diagram illustrating a specific configuration example of a synchronization circuit illustrated in FIG. 17.

FIG. 19 is a timing chart illustrating an example of output timings of signals in the configuration example of the synchronization circuit illustrated in FIG. 18.

FIG. 29 is a flowchart illustrating an example of an operation of controlling set values of timing setting signals of the transmission device in the electronic apparatus according to the first embodiment.

FIG. 30 is an explanatory diagram illustrating an example of radio bands to be used by the electronic apparatus according to the first embodiment.

FIG. 31 is an explanatory diagram illustrating an example of a relationship between the radio bands to be used by the electronic apparatus according to the first embodiment and a spectrum characteristic of EMI that occurs in the electronic apparatus.

FIG. 32 is an explanatory diagram illustrating an example of a relationship between the spectrum characteristic of EMI and the radio bands after changing operation frequency of the transmission device in the electronic apparatus according to the first embodiment.

FIG. 33 is an explanatory diagram illustrating an example of settable frequency of the operation frequency of the transmission device in the electronic apparatus according to the first embodiment.

FIG. 34 is a flowchart illustrating an example of an operation of controlling the operation frequency of the transmission device in the electronic apparatus according to the first embodiment.

FIG. 35 is a circuit diagram illustrating a configuration example of a main part of a transmission device according to a modification example of the first embodiment.

FIG. 36 is a circuit diagram illustrating a configuration example of a main part of a transmission device according to a second embodiment.

FIG. 37 is an explanatory diagram illustrating an example of transition between symbols that the transmission device according to the second embodiment transmits.

MODES FOR CARRYING OUT THE INVENTION

In the following, some embodiments of the present disclosure are described in detail with reference to the drawings. It is to be noted that description is given in the following order.
0. Comparative Example (FIGS. 1 to 15)
1. First Embodiment (FIGS. 16 to 35)
   1.1 Configuration Example and Operation Example of Transmission Device
   1.2 Example of Application to Electronic Apparatus
   1.3 Modification Example
   1.4 Effects
2. Second Embodiment (FIGS. 36 to 37)
3. Third Embodiment (FIG. 38)
4. Other Embodiments

Comparative Example

Outline and Issue of Transmission Device According to Comparative Example

When a differential signal is transmitted through a transmission line formed in a print substrate or the like, common mode noise generated in the differential signal becomes radiation noises, which causes EMI (Electro Magnetic Interference) to deteriorate. In a case where EMI arising from the differential signal becomes problematic, it is beneficial to suppress the common mode noise. As a method of suppressing the common mode noise, there is a method of attenuating the common mode noise by disposing a common mode choke filter to a differential signal transmission line wired to a printed board. However, if a new mounting component is added to the printed board or the like as described above, there is a disadvantage that the component cost is correspondingly increased. The common mode noise mainly occurs in LSI (Large Scale Integration) that is a circuit for transmitting the differential signal. It is desirable that the transmitting circuit suppresses the common mode noise generated in the transmitting circuit, and if this is achievable, it is possible to avoid excessive costs due to the above-described common mode choke filter.

When driving the differential signal outputted from LSI, in order to reduce the common mode noise, a rise time and a fall time of a plurality of output signals configuring the differential signal may be the same. At this time, if a drive capability at a rising edge and a drive capability at a falling edge in a plurality of output circuits that outputs the plurality of output signals are exactly the same, input timings of input signals to the respective output circuits may be set to be the same as each other.

Figure 1:
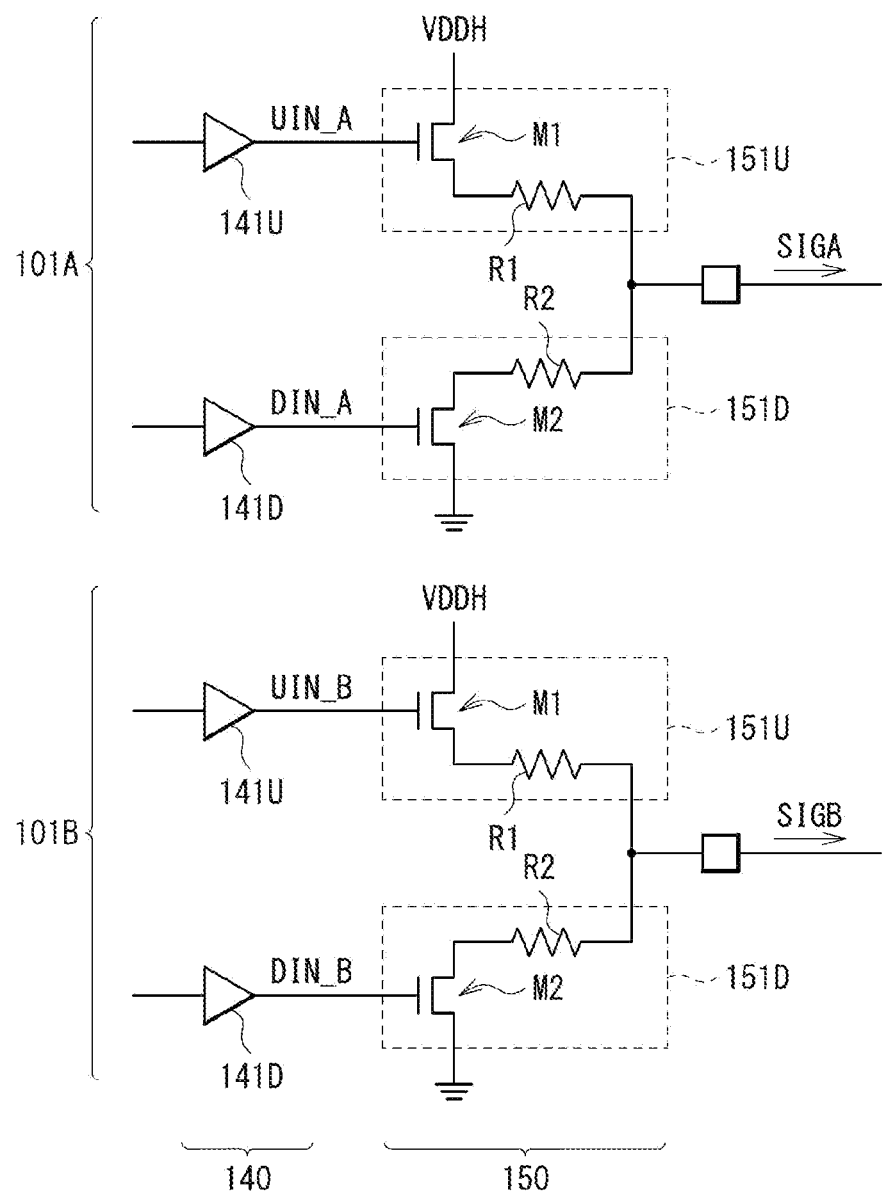
FIG. 1 is a circuit diagram illustrating a configuration example of a transmission device according to a comparative example that outputs a two-valued differential signal.

FIG. 1 illustrates a configuration example of a transmission device according to a comparative example that outputs a two-valued differential signal.

The transmission device according to the comparative example outputs an output signal SIGA and an output signal SIGB that configure the two-valued differential signal and have respective signal levels that are different from each other. The transmission device according to the comparative example includes a driver circuit 150, and a pre-driver circuit 140 disposed in a preceding stage of the driver circuit 150. The pre-driver circuit 140 and the driver circuit 150 configure an output circuit 101A that outputs the output signal SIGA and an output circuit 101B that outputs the output signal SIGB.

The pre-driver circuit 140 in the output circuit 101A includes a rise circuit 141U and a fall circuit 141D. The driver circuit 150 in the output circuit 101A includes a rise circuit 151U and a fall circuit 151D. Similarly, the pre-driver circuit 140 in the output circuit 101B includes a rise circuit 141U and a fall circuit 141D. The driver circuit 150 in the output circuit 101B includes a rise circuit 151U and a fall circuit 151D.

The rise circuit 151U includes a MOS transistor M1 and a resistor R1. The fall circuit 151D includes a MOS transistor M2 and a resistor R2. Each of the MOS transistors M1 and M2 includes an N-ch MOSFET (Metal Oxide Semiconductor Field Effect Transistor). A drain of the MOS transistor M1 is supplied with a power supply voltage VDDH. A source of the MOS transistor M2 is grounded.

Respective current drive capabilities of the rise circuit 151U and the fall circuit 151D in the driver circuit 150 are ideally the same.

Figure 2:
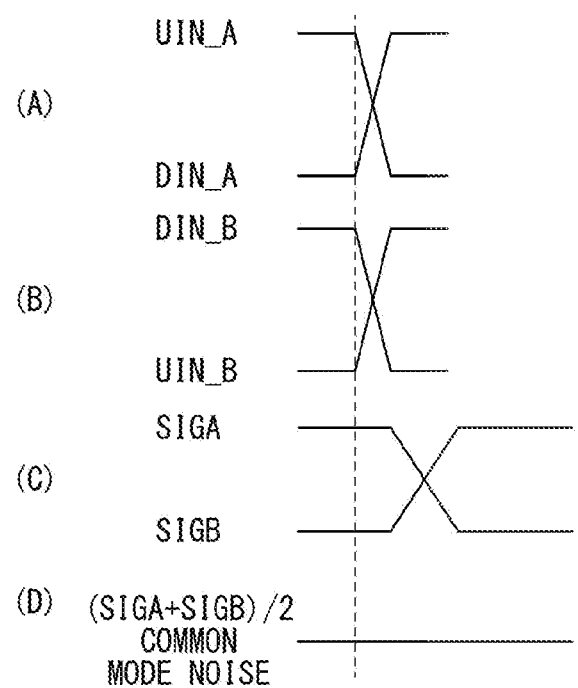
FIG. 2 is a timing chart illustrating an example of ideal operation timings of a plurality of input/output signals and an occurrence timing of common mode noise in a driver circuit illustrated in FIG. 1.

FIG. 2 is a timing chart illustrating an example of ideal operation timings of a plurality of input/output signals and an occurrence timing of common mode noise in the driver circuit 150 illustrated in FIG. 1. In FIG. 2, (A) illustrates operation timings, in the output circuit 101A of the driver circuit 150, of a driver input signal UIN_A to be inputted to the MOS transistor M1 and a driver input signal DIN_A to be inputted to the MOS transistor M2. In FIG. 2, (B) illustrates operation timings, in the output circuit 101B of the driver circuit 150, of a driver input signal UIN_B to be inputted to the MOS transistor M1 and a driver input signal DIN_B to be inputted to the MOS transistor M2. In FIG. 2, (C) illustrates operation timings of the output signal SIGA and the output signal SIGB. In FIG. 2, (D) illustrates the occurrence timing of the common mode noise.

In an ideal state illustrated in FIG. 2, no common mode noise occurs. However, considering manufacturing variability of LSI, voltage variation, and the like, it is difficult to make the driver drive capability at the rising edge and the driver drive capability at the falling edge in the driver circuit 150 the same depending on conditions, and there are cases where these are slightly different. Similarly, a timing difference between a plurality of driver input signals is likely to occur. For these reasons, a difference may occur between the rise time and the fall time of the output signal SIGA and the output signal SIGB, which makes it difficult to reduce the common mode noise.

Figure 3:
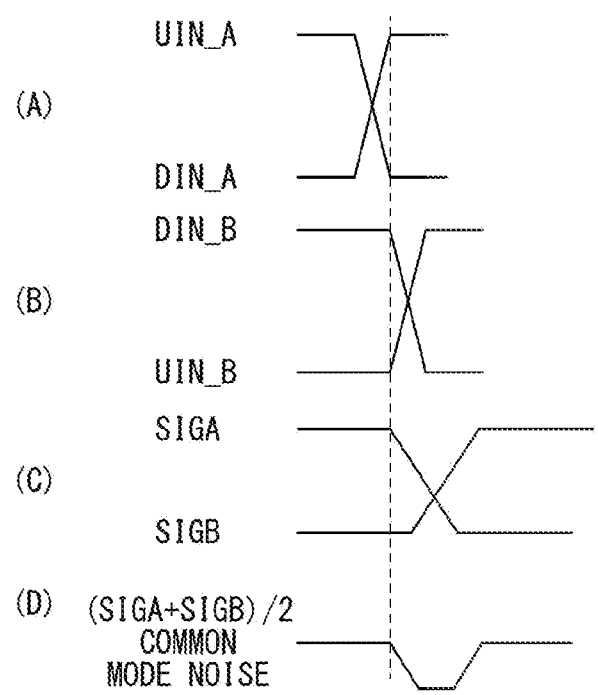
FIG. 3 is a timing chart illustrating an example of operation timings of the input/output signals and an occurrence timing of the common mode noise in a case where a timing difference occurs between a plurality of driver input signals in the driver circuit illustrated in FIG. 1.

FIG. 3 is a timing chart illustrating an example of operation timings of the input/output signals and an occurrence timing of the common mode noise in a case where a timing difference occurs between the plurality of driver input signals in the driver circuit 150 illustrated in FIG. 1. In FIG. 3, (A) to (D) illustrate timings similar to those of (A) to (D) in FIG. 2.

In a case where the timing difference occurs between the plurality of driver input signals as illustrated in (A) and (B) in FIG. 3, the difference occurs between the rise time and the fall time of the output signal SIGA and the output signal SIGB as illustrated in (C) in FIG. 3. As a result, the common mode noise occurs as illustrated in (D) in FIG. 3.

As a method of suppressing the common mode noise caused by the timing difference between the plurality of driver input signals, there is a method of adjusting the timings of the driver input signals or the output signals SIGA and SIGB.

Figure 4:
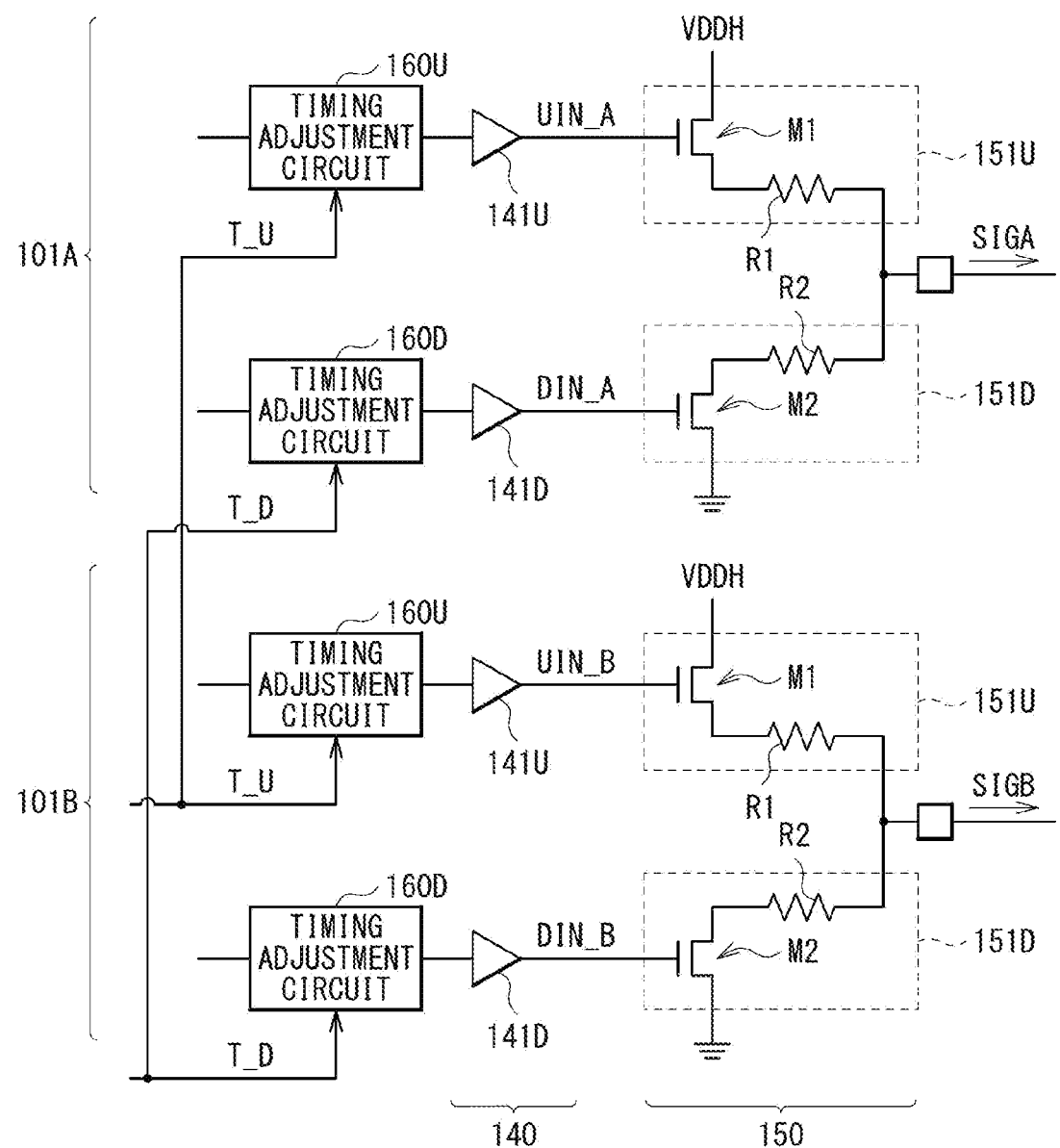
FIG. 4 is a circuit diagram illustrating a configuration example in which timing adjustment circuits are disposed in a preceding stage of a pre-driver circuit in the transmission device according to the comparative example illustrated in FIG. 1.

FIG. 4 illustrates a configuration example in which timing adjustment circuits 160U and 160D are disposed in a preceding stage of the pre-driver circuit 140 in the transmission device illustrated in FIG. 1.

In the configuration example illustrated in FIG. 4, the timing adjustment circuits 160U and 160D are disposed in the preceding stage of the rise circuit 141U and the preceding stage of the fall circuit 141D, respectively, in each of the output circuits 101A and 101B. The timing adjustment circuits 160U and 160D each include, for example, a delay element, a circuit that selects a signal delayed by the delay element, and the like. The delay element includes a CMOS inverter, a capacitor, and the like. The timing adjustment circuits 160U and 160D operate on the basis of set values of entered timing setting signals T_D and T_U.

Figure 5:
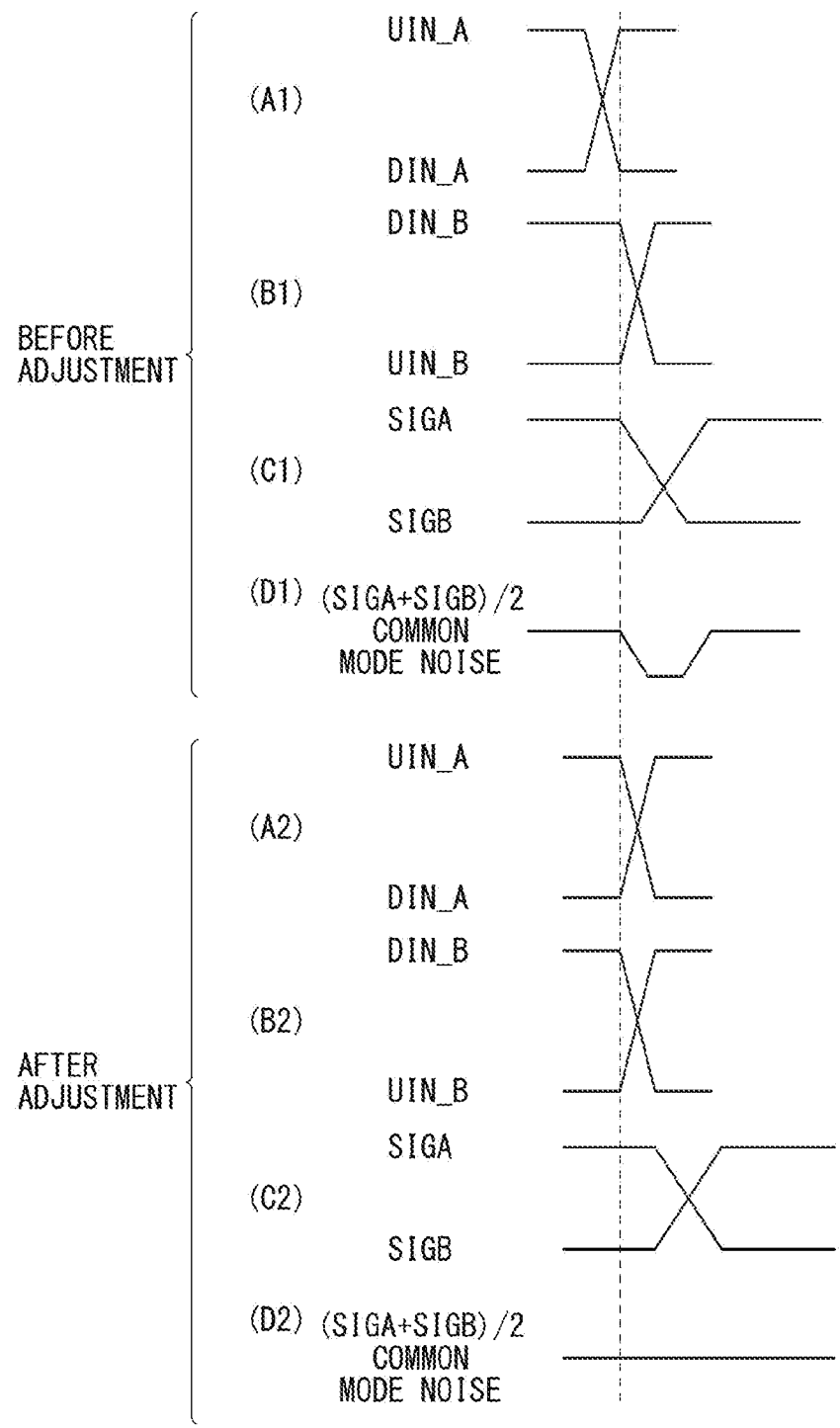
FIG. 5 is a timing chart illustrating an example of operation timings of the input/output signals and an occurrence timing of the common mode noise before and after timing adjustment performed by the timing adjustment circuits, in the transmission device according to the comparative example illustrated in FIG. 4.

FIG. 5 is a timing chart illustrating an example of operation timings of the input/output signals and an occurrence timing of the common mode noise before and after timing adjustment performed by the timing adjustment circuits 160U and 160D, in the transmission device illustrated in FIG. 4. In FIG. 5, (A1) to (D1) illustrate timings similar to those of (A) to (D) in FIG. 2 prior to timing adjustment. In FIG. 5, (A2) to (D2) illustrate timings similar to those of (A) to (D) in FIG. 2 after timing adjustment.

A timing difference that occurs between the plurality of driver input signals ((A1) and (B1) in FIG. 5) is adjusted by the timing adjustment circuits 160U and 160D as illustrated in (A2) and (B2) in FIG. 5. Thus, the difference that has occurred between the rise time and the fall time of the output signal SIGA and the output signal SIGB ((C1) in FIG. 5) is corrected as illustrated in (C2) in FIG. 5. As a result, the common mode noise that has occurred ((D1) in FIG. 5) is suppressed as illustrated in (D2) in FIG. 5.

Figure 6:
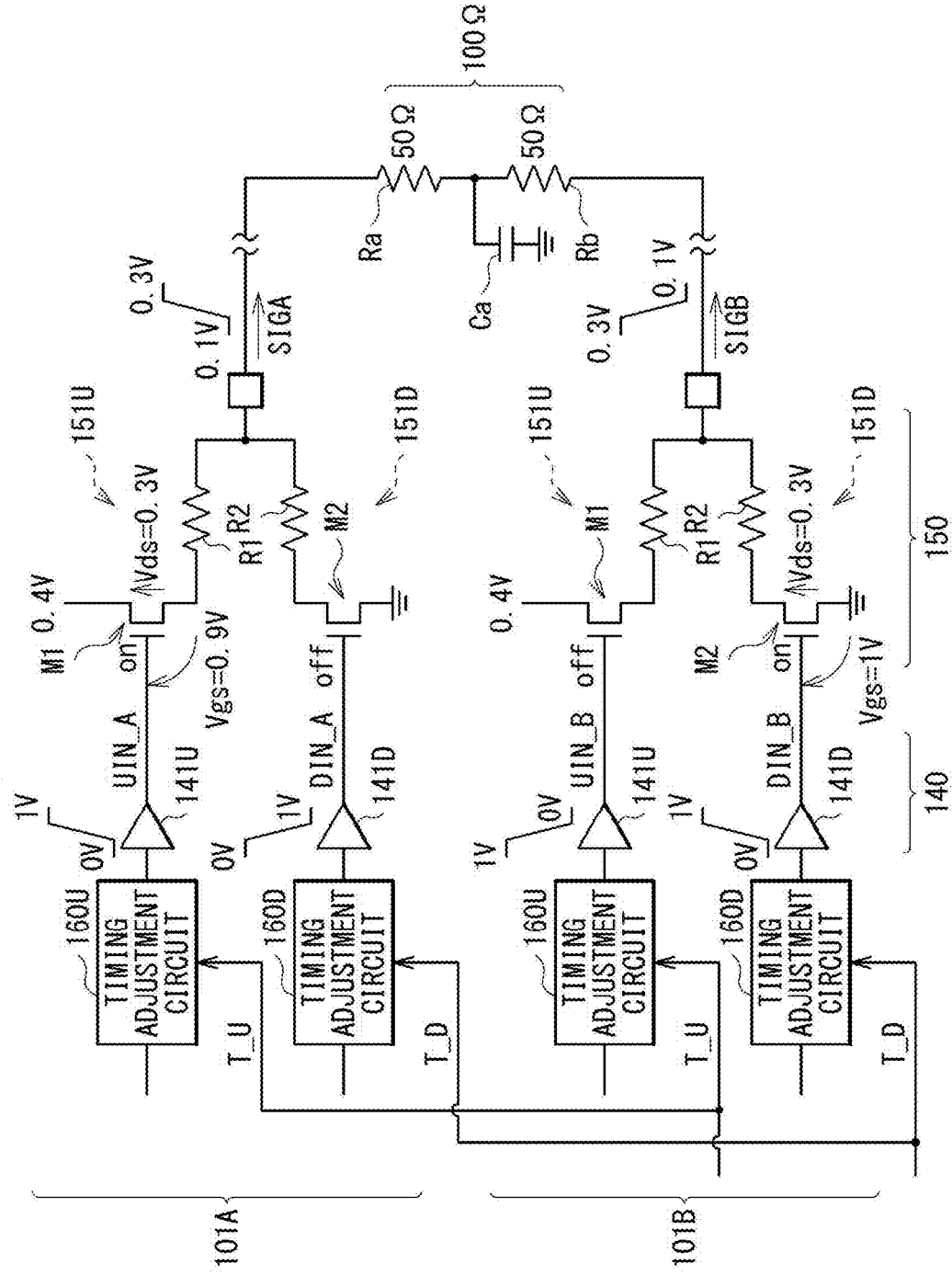
FIG. 6 is a circuit diagram illustrating an example of a transition state of a signal level of each unit of the transmission device according to the comparative example illustrated in FIG. 4.

FIG. 6 illustrates an example of a transition state of a signal level of each unit of the transmission device illustrated in FIG. 4.

In FIG. 6, the driver drive capability of each of the output circuits 101A and 101B of the driver circuit 150 is set to 50Ω, and resistors Ra and Rb each having a resistance of 50Ω serving as termination resistors are coupled to respective transmission lines of the plurality of output signals SIGA and SIGB, to illustrate the transition state of the signal level of each unit. An output level of the pre-driver circuit 140 is set from 0 V (low level) to 1 V (high level), and a power supply voltage VDDH of the MOS transistor M1 of the driver circuit 150 is set to 0.4 V. One end of a load capacity Ca is coupled between the resistors Ra and Rb.

FIG. 7 illustrates an example of the operation timings of the plurality of input/output signals in the driver circuit 150 illustrated in FIG. 6. In FIG. 7, (A) illustrates the operation timings, in the output circuit 101A of the driver circuit 150, of the driver input signal UIN_A to be inputted to the MOS transistor M1 and the driver input signal DIN_A to be inputted to the MOS transistor M2. In FIG. 7, (B) illustrates the operation timings, in the output circuit 101B of the driver circuit 150, of the driver input signal UIN_B to be inputted to the MOS transistor M1 and the driver input signal DIN_B to be inputted to the MOS transistor M2. In FIG. 7, (C) illustrates the operation timings of the output signal SIGA and the output signal SIGB.

In FIG. 7, for example, when the transition state of the signal is in transition (2), the driver input signal UIN_A and the driver input signal DIN_B make a transition from low level (0 V) to high level (1 V). At the same time, in transition (2), the driver input signal UIN_B and the driver input signal DIN_A make a transition from high level to low level. In transition (2), the output signal SIGA makes a transition from low level (0.1 V) to high level (0.3 V), and the output signal SIGB makes a transition from high level (0.3 V) to low level (0.1 V).

It is to be noted that, strictly speaking, the plurality of output signals SIGA and SIGB each make a transition even during the transition of each driver input signal. However, it is not possible that each of the plurality of output signals SIGA and SIGB immediately makes a steep transition due to influences of a parasitic capacity of each MOS transistor in the driver circuit 150, a wiring capacity of a wiring line that follows each MOS transistor, and the like. Thus, FIG. 7 schematically illustrates the operation timings of the plurality of output signals SIGA and SIGB each making a transition immediately after the transition of each driver input signal.

FIG. 8 illustrates an example of a gate-source voltage Vgs and a drain-source voltage Vds of each of the MOS transistors M1 and M2 that are in an on state in the driver circuit 150, in each transition state illustrated in FIG. 7.

As illustrated in FIG. 8, there is a feature in that the gate-source voltage Vgs and the drain-source voltage Vds of each of the MOS transistors M1 and M2 do not change at the time of transitions, regardless of whether they are in transition (1) or transition (2). Accordingly, if a difference occurs between the driver drive capability at the rising edge and the driver drive capability at the falling edge in the driver circuit 150, or if a timing difference occurs between the plurality of driver input signals, and when the timing adjustment circuits 160U and 160D perform timing adjustment, the timing setting signals T_D and T_U in FIG. 6 only have to be set to constant set values.

FIG. 9 illustrates a configuration example of a transmission device according to the comparative example that outputs a four-valued differential signal. The transmission device according to the comparative example illustrated in FIG. 9 schematically illustrates an example of a circuit that outputs the four-valued differential signal, which is used for, for example, PAM4 (Pulse Amplitude Modulation 4), MIPI (Mobile Industry Processor Interface) C-PHY, or the like.

The transmission device according to the comparative example outputs a plurality of output signals SIGA, SIGB, and SIGC that configure the four-valued differential signal and have respective signal levels that are different from each other. The transmission device according to the comparative example includes a driver circuit 50, and a pre-driver circuit 40 disposed in a preceding stage of the driver circuit 50. The pre-driver circuit 40 and the driver circuit 50 configure an output circuit 1A that outputs the output signal SIGA, an output circuit 1B that outputs the output signal SIGB, and an output circuit 1C that outputs the output signal SIGC.

The pre-driver circuit 40 in the output circuit 1A includes a high-level circuit 41A1, a mid (medium)-level circuit 41A2, and a low-level circuit 41A3. The pre-driver circuit 40 in the output circuit 1B includes a high-level circuit 41B1, a mid-level circuit 41B2, and a low-level circuit 41B3. The pre-driver circuit 40 in the output circuit 1C includes a high-level circuit 41C1, a mid-level circuit 41C2, and a low-level circuit 41C3.

The driver circuit 50 in the output circuit 1A includes: a high-level MOS transistor M_A1 and a resistor R_A1; a mid-level MOS transistor M_A2 and a resistor R_A2; and a low-level MOS transistor M_A3 and a resistor R_A3. A driver input signal A_up is to be inputted to the MOS transistor M_A1. A driver input signal A_mid is to be inputted to the MOS transistor M_A2. A driver input signal A_dn is to be inputted to the MOS transistor M_A3.

The driver circuit 50 in the output circuit 1B includes: a high-level MOS transistor M_B1 and a resistor R_B1; a mid-level MOS transistor M_B2 and a resistor R_B2; and a low-level MOS transistor M_B3 and a resistor R_B3. A driver input signal B_up is to be inputted to the MOS transistor M_B1. A driver input signal B_mid is to be inputted to the MOS transistor M_B2. A driver input signal B_dn is to be inputted to the MOS transistor M_B3.

The driver circuit 50 in the output circuit 1C includes: a high-level MOS transistor M_C1 and a resistor R_C1; a mid-level MOS transistor M_C2 and a resistor R_C2; and a low-level MOS transistor M_C3 and a resistor R_C3. A driver input signal C_up is to be inputted to the MOS transistor M_C1. A driver input signal C_mid is to be inputted to the MOS transistor M_C2. A driver input signal C_dn is to be inputted to the MOS transistor M_C3.

FIG. 10 is a timing chart illustrating an example of operation timings of the plurality of output signals SIGA, SIGB, and SIGC to be outputted from the driver circuit 50 of the transmission device illustrated in FIG. 9.

In the transmission device according to the comparative example illustrated in FIG. 9, in a case where any one of the plurality of output signals SIGA, SIGB, and SIGC is to be outputted, any one of the driver input signals *_up, *_mid, and *_dn is turned into high level to drive the driver circuit 50. Here: "*_up" indicates any one of the driver input signals A_up, B_up, and C_up; "*_mid" indicates any one of the driver input signals A_mid, B_mid, and C_mid; and "*_dn" indicates any one of the driver input signals A_dn, B_dn, and C_dn.

As the plurality of output signals SIGA, SIGB, and SIGC, when outputting high level, the driver input signal *_up turns into high level, and when outputting medium level, the driver input signal *_mid turns into high level. When outputting low level, the driver input signal *_dn turns into high level.

In FIG. 9, each MOS transistor in the driver circuit 50 includes an N-ch MOSFET. In FIG. 9, for example: a power supply voltage coupled to each of the high-level MOS transistors M_A1, M_B1, and M_C1 is set to 0.4 V; and a power supply voltage coupled to each of the mid-level MOS transistors M_A2, M_B2, and M_C2 is set to 0.2 V. Further, the driver drive capability of each of the output circuit 1A, 1B, and 1C of the driver circuit 50 is set to 50Ω, and respective one ends of resistors Ra, Rb, and Rc each having a resistance of 50Ω are coupled to respective output terminals of the plurality of output signals SIGA, SIGB, and SIGC as termination resistors. The respective other ends of the resistors Ra, Rb, and Rc are commonly coupled to each other, and one end of the load capacity Ca is coupled.

With such a configuration, as illustrated in FIG. 10, it is possible to output, as the plurality of output signals SIGA, SIGB, and SIGC, which are set to high level of 0.3 V, medium level of 0.2 V. and low level of 0.1 V.

As illustrated in FIG. 10, there are a plurality of transition states in accordance with the respective possible signal levels of the plurality of output signals SIGA, SIGB, and SIGC to be outputted from the driver circuit 50. There are transitions (1), (2), (3), (4), and (5) as kinds of transitions, and there are also five states of signal levels after the transitions, i.e., states (1), (2), (3), (4), and (5). In FIG. 10, the plurality of output signals SIGA, SIGB, and SIGC is provided from the top in this order; however, even if the order of the output signals is changed, the transition states of the signal levels are entirely covered.

It is to be noted that, strictly speaking, the plurality of output signals SIGA, SIGB, and SIGC each make a transition even during the transition of each driver input signal. However, it is not possible that each of the plurality of output signals SIGA, SIGB, and SIGC immediately makes a steep transition due to influences of a parasitic capacity of each MOS transistor in the driver circuit 50, a wiring capacity of a wiring line that follows each MOS transistor, and the like. Thus, FIG. 10 schematically illustrates the operation timings of the plurality of output signals SIGA, SIGB, and SIGC each making a transition immediately after the transition of each driver input signal.

FIG. 11 illustrates an example of differential signal levels of differential signals to be outputted from the transmission device illustrated in FIG. 9. FIG. 11 illustrates the differential signal levels in states (1), (2), (3), (4), and (5) of FIG. 10. It is to be noted that "A" indicates the output signal SIGA, "B" indicates the output signal SIGB, and "C" indicates the output signal SIGC. There are three differential signals, i.e., (SIGA-SIGB), (SIGB-SIGC), and (SIGC-SIGA), and each of these states indicates four values, for example, −0.1 V/0.1 V/−0.2 V/0.2 V. That is, the transmission device according to the comparative example illustrated in FIG. 9 outputs the four-valued differential signal.

FIG. 12 is a circuit diagram illustrating an example of the transition states of the driver input signals in the transmission device illustrated in FIG. 9. It is to be noted that FIG. 12 illustrates an example in which the transition state is transition (1) illustrated in FIG. 10. Regarding an output level of the pre-driver circuit 40, low level is set to 0 V, and high level is set to 1 V.

FIG. 13 illustrates an example of a gate-source voltage Vgs and a drain-source voltage Vds of the MOS transistor M_* in an on state in the driver circuit 50, in each transition state of transitions (1), (2), (3), (4), and (5) illustrated in FIG. 10. It is to be noted that "M_*" indicates any MOS transistor in the driver circuit 50.

First, attention is paid to a case where the signal level makes a transition to medium level. Comparing the output signal SIGA of transition (1) with the output signal SIGB of transition (3), it is appreciated that the gate-source voltages Vgs to be applied to the MOS transistors M_* are different from each other when outputting the signal of medium level.

Next, attention is paid to a case where the signal level makes a transition to high level. Comparing the output signal SIGA of transition (4) with the output signal SIGB of transition (1), it is appreciated that the gate-source voltages Vgs and the drain-source voltages Vds to be applied to the MOS transistors M_* are different from each other when outputting the signal of high level.

Lastly, attention is paid to a case where the signal level makes a transition to low level. Comparing the output signal SIGA of transition (3) with the output signal SIGB of transition (2), it is appreciated that the drain-source voltages Vds to be applied to the MOS transistors M_* are different from each other when outputting the signal of low level.

Figure 14:
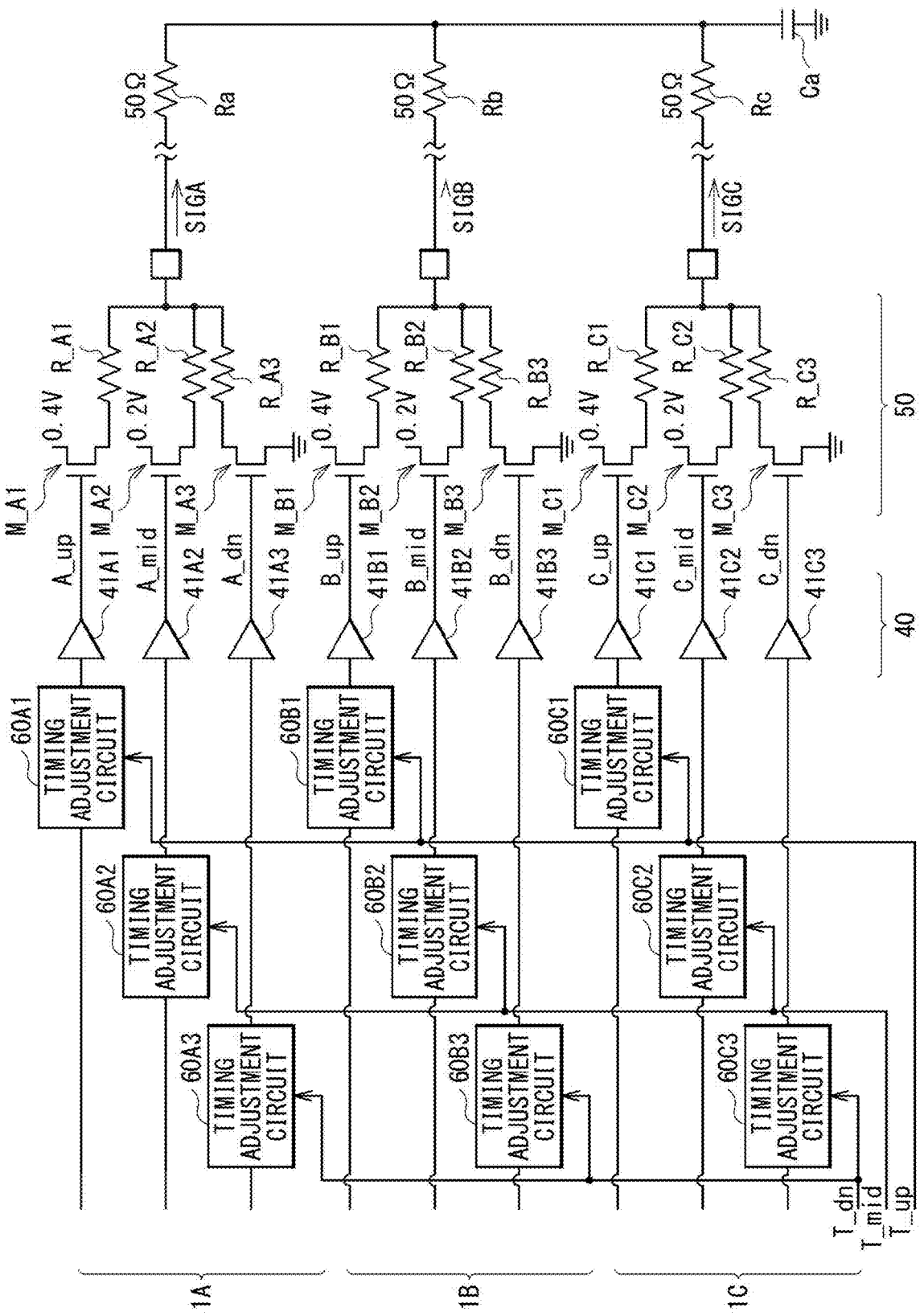
FIG. 14 is a circuit diagram illustrating a configuration example in which timing adjustment circuits are disposed in a preceding stage of a pre-driver circuit in the transmission device according to the comparative example illustrated in FIG. 9.

FIG. 14 illustrates a configuration example in which timing adjustment circuits are disposed in a preceding stage of the pre-driver circuit 40 in the transmission device according to the comparative example illustrated in FIG. 9.

The transmission device according to the comparative example illustrated in FIG. 14 has the same concept as the configuration example (FIG. 4) in which the timing adjustment circuits 160U and 160D are disposed in the preceding stage of the pre-driver circuit 140 in the transmission device according to the comparative example that outputs the two-valued differential signal.

In the transmission device according to the comparative example illustrated in FIG. 14, a timing adjustment circuit 60A1, a timing adjustment circuit 60A2, and a timing adjustment circuit 60A3 are respectively disposed in the preceding stages of the high-level circuit 41A1, the mid-level circuit 41A2, and the low-level circuit 41A3 in the pre-driver circuit 40.

Further, a timing adjustment circuit 60B1, a timing adjustment circuit 60B2, and a timing adjustment circuit 60B3 are respectively disposed in the preceding stages of the high-level circuit 41B1, the mid-level circuit 41B2, and the low-level circuit 41B3 in the pre-driver circuit 40.

Further, a timing adjustment circuit 60C1, a timing adjustment circuit 60C2, and a timing adjustment circuit 60C3 are respectively disposed in the preceding stages of the high-level circuit 41C1, the mid-level circuit 41C2, and the low-level circuit 41C3 in the pre-driver circuit 40.

Hereinafter, any one of the plurality of timing adjustment circuits 60A1, 60A2, 60A3, 60B1, 60B2, 60B3, 60C1, 60C2, 60C3 or any of the plurality of timing adjustment circuits is collectively referred to as timing adjustment circuit 60.

The timing adjustment circuit 60 includes, for example, a delay element, a circuit that selects a signal delayed by the delay element, and the like. The delay element includes a CMOS inverter, a capacitor, and the like. The timing adjustment circuits 60A1, 60B1, and 60C1 each operate on the basis of a set value of an entered timing setting signal T_up. The timing adjustment circuits 60A2, 60B2, and 60C2 each operate on the basis of a set value of an entered timing setting signal T_mid. The timing adjustment circuits 60A3, 60B3, and 60C3 each operate on the basis of a set value of an entered timing setting signal T_dn.

If a difference occurs between the driver drive capability at the rising edge and the driver drive capability at the falling edge in the driver circuit 50, or if a timing difference occurs between the plurality of driver input signals, the timing adjustment circuit 60 adjusts the timing of inputting the driver input signal, which makes it possible to reduce the common mode noise of the differential signal to be outputted. In this case, the timing setting signals T_dn, T_mid, and T_up are each provided with an appropriate set value to adjust the operation timing and reduce the common mode noise.

As described above, in the driver circuit 150 that outputs the two-valued differential signal, when the signal level makes a transition, the gate-source voltage Vgs and the drain-source voltage Vds of each of the MOS transistor that outputs high level and the MOS transistor that outputs low level do not change depending on the transition states of the signal levels. This makes it possible to set the respective set values of the timing setting signals T_U and T_D to fixed values to adjust the timings.

However, in the driver circuit 50 that outputs the four-valued differential signal, it is difficult to reduce the common mode noise even if timing adjustment is performed by a method similar to that of the case of the two-valued. Depending on the transition states of the signal levels, the drain-source voltages Vds and the gate-source voltages Vgs to be applied to the MOS transistors of the driver circuit 50 are different from each other. The different gate-source voltages Vgs or the different drain-source voltages Vds mean that transition speeds of the signal levels of the signals outputted from the driver circuit 50 are different from each other. Thus, for example, the speed at which the signal level of the output signal SIGA makes a transition to medium level (0.2 V) in transition (1) in FIG. 10 is different from the speed at which the signal level of the output signal SIGB makes a transition to medium level (0.2 V) in transition (3) in FIG. 10.

In the timing adjustment method described above, the respective set values of the timing setting signals T_dn, T_mid, and T_up are fixed values regardless of the transition states of the signal levels. This causes the timing difference between the plurality of output signals as described above. As a result, it is difficult to reduce the common mode noise by using such adjustment circuits.

Figure 15:
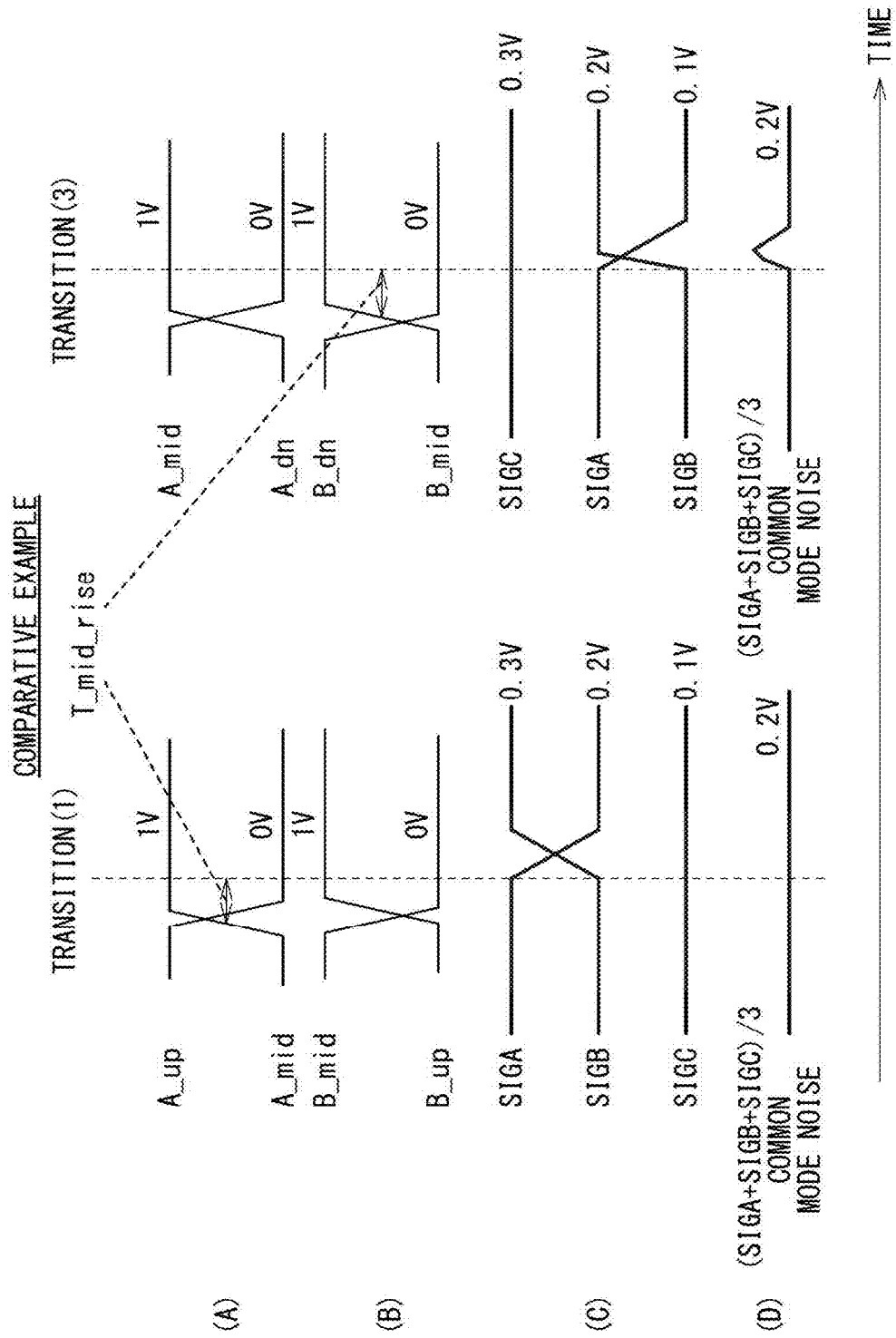
FIG. 15 is a timing chart illustrating an example of operation timings of a plurality of input/output signals and an occurrence timing of common mode noise in the driver circuit, in a case where timing adjustment is performed by the timing adjustment circuits, in the transmission device according to the comparative example illustrated in FIG. 14.

FIG. 15 is a timing chart illustrating an example of operation timings of the plurality of input/output signals and an occurrence timing of the common mode noise in the driver circuit, in a case where timing adjustment is performed by the timing adjustment circuits 60, in the transmission device according to the comparative example illustrated in FIG. 14. In FIG. 15, (A) illustrates operation timings, in the output circuit 1A of the driver circuit 50, of the driver input signal A_up to be inputted to the MOS transistor M_A1 and the driver input signal A_mid to be inputted to the MOS transistor M_A2. In FIG. 15, (B) illustrates operation timings, in the output circuit 1B of the driver circuit 50, of the driver input signal B_up to be inputted to the MOS transistor M_B1 and the driver input signal B_mid to be inputted to the MOS transistor M_B2. In FIG. 15, (C) illustrates respective operation timings of the plurality of output signals SIGA, SIGB, and SIGC. In FIG. 15. (D) illustrates the occurrence timing of the common mode noise.

FIG. 15 illustrates a case where a timing is adjusted in such a manner that the common mode noise in transition (1) is minimized. T_mid_rise represents a transition time from the transition of the signal level of the driver input signal of the MOS transistor that outputs medium level after the timing adjustment until immediately before the transition of the signal levels of the plurality of output signals. In this case, the transition time T_mid_rise in transition (1) and the transition time T_mid_rise in transition (3) are the same. As illustrated in FIG. 13, the gate-source voltage Vgs to be applied to the MOS transistor M_A2 that outputs medium level in transition (3) is higher by 0.1 V than that to be applied to the MOS transistor M_B2 that outputs medium level in transition (1), and thus has a faster transition speed. Accordingly, the common mode noise occurs in transition (3).

It is to be noted that, in the configuration example of FIG. 14, as illustrated in FIGS. 10 to 13, there are three signal levels in each of the plurality of output signals SIGA, SIGB, and SIGC, i.e., low level (0.1 V), medium level (0.2 V), and high level (0.3 V). In addition, the driver input signal at the time of turning each MOS transistor of the driver circuit 50 into the on state is 1 V.

When any one of the signal levels of the plurality of output signals SIGA, SIGB, and SIGC is caused to make a transition to medium level, since the original signal level is low level (0.1 V) or high level (0.3 V), there are two kinds of gate-source voltages Vgs to be applied for causing medium level to drive, i.e., 1 V−0.1 V=0.9 V and 1 V−0.2 V=0.8 V. Here, a reason why it is 1 V−0.2 V and not 1 V−0.3 V is that the power supply voltage=0.2 V of the MOS transistor of medium level is smaller than 0.3 V, and 0.2 V side becomes a source.

In the driver circuit 150 that outputs the two-valued differential signal illustrated in FIG. 6, such a phenomenon does not occur. There are two signal levels of the output, i.e., low level (0.1 V) and high level (0.3 V). Thus, where the driver input signal for turning the MOS transistor into the on state is set to 1 V, there are only two kinds. Vgs is 1 V−0 V=1.0 V in a case of making a transition to low level; and Vgs is 1 V−0.1 V=0.9 V in a case of making a transition to high level. A reason why Vgs is not 1 V−0.3 V in a case of making a transition to low level is that the source of the MOS transistor is in GND level when making a transition to low level.

As described above, in the case where the states of the signal levels of the plurality of output signals SIGA, SIGB, and SIGC are three or more, the gate-source voltages Vgs to be applied to the MOS transistors are different from each other depending on the difference in the states of the previous signal levels even in a case of making a transition to the same signal level.

1. First Embodiment

1.1 Configuration Example and Operation Example of Transmission Device

First, a configuration example and an operation example of a transmission device according to a first embodiment of the present disclosure will be described. It is to be noted that, in the following description, the same reference signs are given to components substantially the same as the components of the transmission device according to the comparative example described above, and the description thereof is omitted as appropriate.

Figure 16:
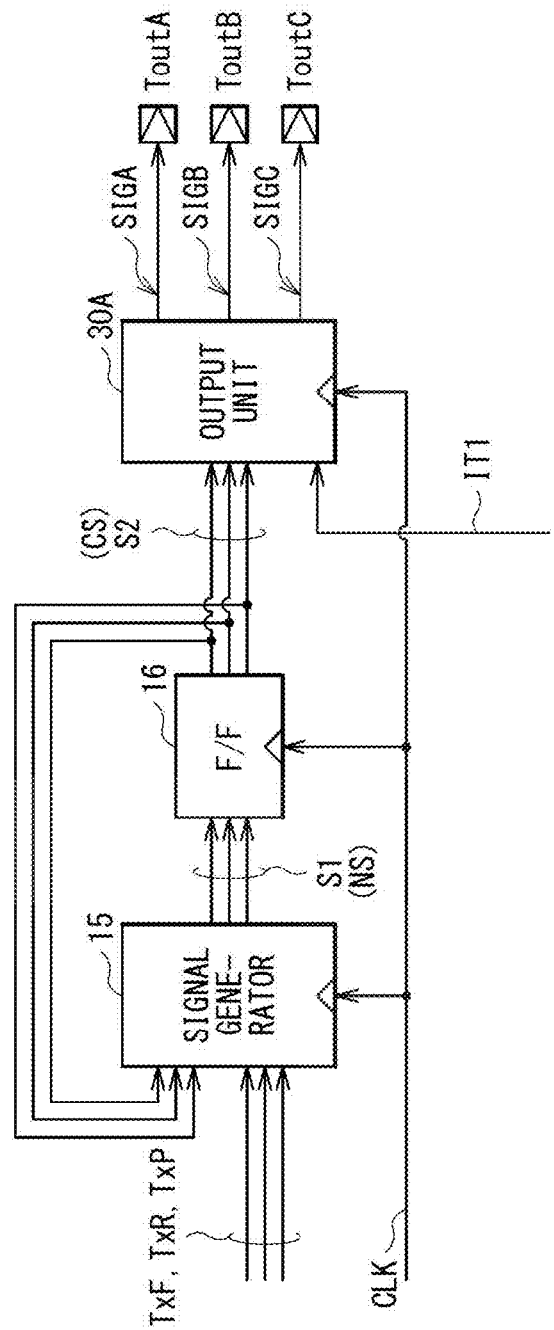
FIG. 16 is a block diagram illustrating an overall configuration example of a transmission device according to a first embodiment of the present disclosure.

FIG. 16 illustrates an overall configuration example of the transmission device according to the first embodiment of the present disclosure.

The transmission device according to the first embodiment includes a signal generator 15, a flip-flop (F/F) 16, an output unit 30A, and a plurality of output terminals ToutA, ToutB, and ToutC.

The transmission device transmits a plurality of symbols CS as transmission data using the plurality of output signals SIGA, SIGB, and SIGC configuring a differential signal. The plurality of output signals SIGA, SIGB, and SIGC is respectively outputted from the plurality of output terminals ToutA, ToutB, and ToutC.

The signal generator 15 determines symbols NS on the basis of the symbols CS, a plurality of signals TxF, TxR, and TxP, and a clock signal CLK. The symbols CS are symbols currently being transmitted (current symbols) and the symbols NS are next symbols to be transmitted (next symbols).

The flip-flop 16 delays a signal S1 by one clock of the clock signal CLK and outputs the delayed signal S1 as a three-bit signal S2. That is, the flip-flop 16 delays the next symbols NS that the signal S1 indicates by one clock of the clock signal CLK to thereby generate the current symbols CS. The flip-flop 16 thereafter supplies the signal S2 to the signal generator 15 and the output unit 30A.

The output unit 30A generates the plurality of output signals SIGA. SIGB, and SIGC on the basis of the signal S2. An operation of the output unit 30A is controlled by a control signal IT1.

The control signal IT1 includes timing setting signals T_i_up, T_i_mid, and T_i_dn to be described later. The signal S2 includes a plurality of pieces of input data DinA, DinB, and DinC to be described later.

Figure 17:
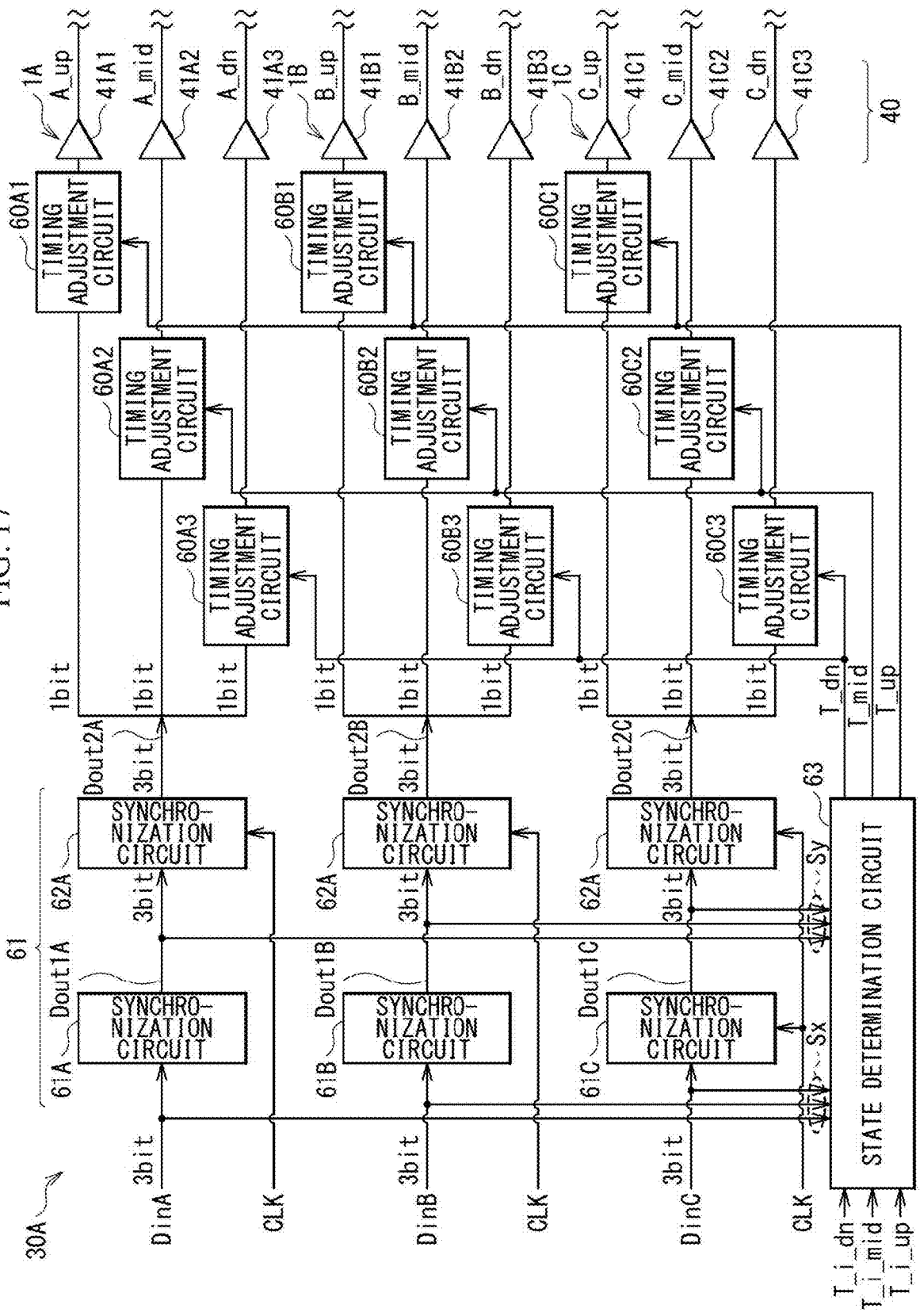
FIG. 17 is a circuit diagram illustrating a configuration example of a main part of the transmission device according to the first embodiment.

FIG. 17 illustrates a configuration example of a main part of the transmission device according to the first embodiment.

FIG. 17 illustrates a configuration example of the output unit 30A as the main part of the transmission device illustrated in FIG. 16. The configuration example illustrated in FIG. 17 has a configuration in which, to the circuit configuration of the transmission device according to the comparative example of FIG. 14, a synchronization circuit 61 and a state determination circuit 63 are added as a control circuit that controls set values of the plurality of timing adjustment signals T_up, T_mid, and T_dn. It is to be noted that, although FIG. 17 omits the configuration of the stage subsequent to the pre-driver circuit 40, the configuration of the stage subsequent to the pre-driver circuit 40 is the same as that in FIG. 14. The driver circuit 50 is coupled in the subsequent stage of the pre-driver circuit 40, and the plurality of output signals SIGA, SIGB, and SIGC is outputted from the driver circuit 50.

The synchronization circuit 61 and the state determination circuit 63 are included in a control circuit that changes the set values of the timing setting signals T_up, T_mid, and T_dn to values corresponding to a plurality of transition states of the possible signal levels of each of the plurality of output signals SIGA, SIGB, and SIGC to be outputted from the driver circuit 50. Here, the plurality of transition states represents, for example, transitions (1), (2), (3), (4), and (5) illustrated in FIG. 10.

The synchronization circuit 61 includes a plurality of first synchronization circuits 61A, 61B, and 61C and a plurality of second synchronization circuits 62A, 62B, and 62C.

The plurality of first synchronization circuits 61A, 61B, and 61C delays respective plurality of first input signals on the basis of the clock signal CLK, and outputs a plurality of second input signals. Here, as illustrated in FIG. 17, the plurality of first input signals represents a plurality of pieces of input data DinA, DinB, and DinC. Further, as illustrated in FIG. 17, the plurality of second input signals represents a plurality of output signals Dout1A, Dout1B, and Dout1C.

The plurality of second synchronization circuits 62A, 62B, and 62C delays the respective plurality of second input signals on the basis of the clock signal CLK, and outputs a third input signal to each of the plurality of timing adjustment circuits 60. Here, as illustrated in FIG. 17, the plurality of third input signals represents a plurality of output signals Dout2A, Dout2B, and Dout2C.

The state determination circuit 63 changes the respective set values of the plurality of timing setting signals T_up, T_mid, and T_dn to the values corresponding to the plurality of transition states on the basis of the plurality of first input signals (DinA, DinB, and DinC) corresponding to the plurality of output signals SIGA, SIGB, and SIGC and the plurality of second input signals (Dout1A, Dout1B, and Dout1C) obtained by delaying the plurality of first input signals.

Configuration Example of Synchronization Circuit 61

FIG. 18 illustrates a specific configuration example of the synchronization circuit 61 illustrated in FIG. 17.

FIG. 18 illustrates a configuration example of the first synchronization circuit 61A and the second synchronization circuit 62A responding to the output signal SIGA. It is to be noted that the first synchronization circuit 61B and the second synchronization circuit 62B responding to the output signal SIGB, and the first synchronization circuit 61C and the second synchronization circuit 62C responding to the output signal SIGC may each have a similar configuration.

The configuration example illustrated in FIG. 18 is an example using D-FlipFlops as the synchronization circuit 61. In the D-FlipFlop, the input signal is synchronized with the clock signal CLK and this makes it possible to obtain the output signal synchronized with the clock signal CLK. Here, the D-FlipFlops are coupled in two stages. The D-FlipFlop of the first stage corresponds to the first synchronization circuit 61A, and the D-FlipFlop of the second stage corresponds to the second synchronization circuit 62A.

FIG. 19 is a timing chart illustrating an example of output timings of signals in the configuration example of the synchronization circuit 61 illustrated in FIG. 18.

As illustrated in FIG. 19, the first synchronization circuit 61A outputs the output signal Dout1A obtained by synchronizing the input data DinA with the clock signal CLK and delaying the input data DinA. The second synchronization circuit 62A outputs the output signal Dout2A obtained by synchronizing the output signal Dout1A from the first synchronization circuit 61A with the clock signal CLK and delaying the output signal Dout1A.

Configuration Example of State Determination Circuit 63

Figure 20:
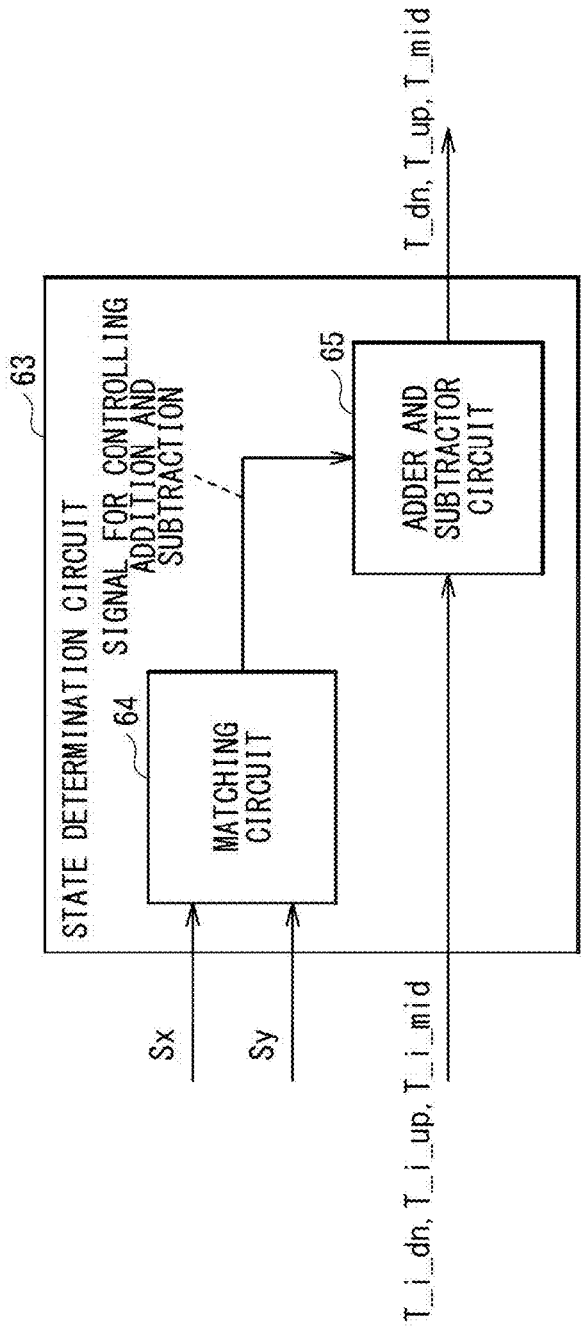
FIG. 20 is a circuit diagram illustrating a specific configuration example of a state determination circuit illustrated in FIG. 17.

FIG. 20 illustrates a specific configuration example of the state determination circuit 63 illustrated in FIG. 17.

The state determination circuit 63 includes a matching circuit 64 and an adder and subtractor circuit 65. The state determination circuit 63 is a circuit that changes the signals to be outputted from the state determination circuit 63 in accordance with logical states of the signals to be inputted to the state determination circuit 63. The input signals of the state determination circuit 63 are a signal group Sx, a signal group Sy, and the plurality of timing setting signals T_i_dn, T_i_up, and T_i_mid. The output signals of the state determination circuit 63 are the timing setting signals T_dn, T_up, and T_mid. As illustrated in FIG. 17, the signal group Sx includes the plurality of pieces of input data DinA, DinB, and DinC to be inputted to the first synchronization circuits 61A, 61B, and 61C. As illustrated in FIG. 17, the signal group Sy includes the plurality of output signals Dout1A, Dout1B, and Dout1C outputted from the first synchronization circuits 61A, 61B, and 61C.

Each of the plurality of timing setting signals T_i_dn, T_i_up, and T_i_mid has a fixed set value that is the basis of the timing setting. For example, if each of the signals is three bits, T_i_dn <2:0>=3'b011, or the like, is satisfied.

The signals to be inputted to the matching circuit 64 are the signal group Sx and the signal group Sy. The matching circuit 64 performs specific outputting if the signal group Sx and the signal group Sy match specific logical states. The specific logics correspond to the logics of states (1) to (5) illustrated in FIG. 10. Example of the matching circuit 64 include a decoding circuit. An output of the matching circuit 64 may have one bit or may have multiple bits.

The adder and subtractor circuit 65 receives the output of the matching circuit 64 and adds or subtracts the respective values of the plurality of the plurality of timing setting signals T_i_dn, T_i_up, and T_i_mid in accordance with the logical states described above. The plurality of timing setting signals T_up, T_mid, and T_dn after being subjected to the addition or the subtraction serves as an output of the adder and subtractor circuit 65. For example, in a case where addition/subtraction is "1", if T_i_dn <2:0>=3'b011 is to be subtracted, the adder and subtractor circuit 65 outputs T_dn <2:0>=3'b010, and if T_i_dn <2:0>=3'b011 is to be added, the adder and subtractor circuit 65 outputs T_dn=3'b100.

Depending on the logical state of the output of the matching circuit 64, the addition/subtraction number may be an integer greater than "1". As for a specific value of the addition/subtraction number, a set value that makes it possible to optimize the common mode noise derived in advance by circuit simulation or the like may be used, or an addition/subtraction value that minimizes the common mode noise based on actual device measurement may be derived by making it possible to change the addition/subtraction value in a register later.

Each of the plurality of timing setting signals T_i_dn, T_i_up, and T_i_mid to be inputted to the state determination circuit 63 is appropriately added and subtracted in accordance with the states of the signal group Sx and the signal group Sy. Lastly, state determination circuit 63 outputs the plurality of timing setting signals T_dn, T_up, and T_mid having optimum timing settings corresponding to five transition states illustrated in FIG. 10.

The circuit configurations illustrated in FIGS. 17 and 20 are merely exemplary configurations. Other configurations may be employed as long as a circuit determines the transition states of the plurality of output signals SIGA, SIGB, and SIGC and, in accordance with the states, changes the existing timing settings into desirable settings dynamically.

Figure 21:
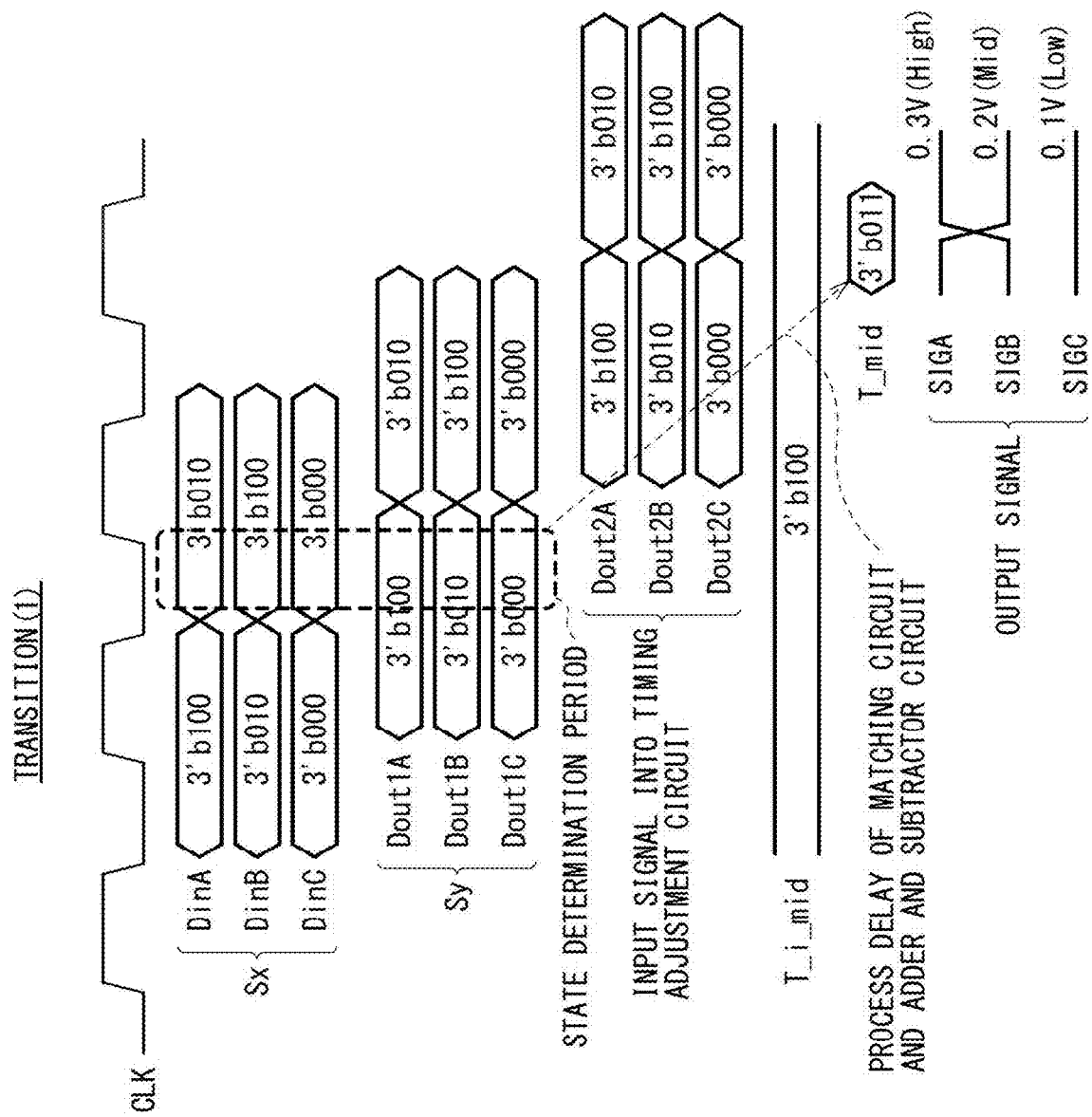
FIG. 21 is a timing chart illustrating a flow of a series of operations from where the transmission device illustrated in FIG. 17 is provided with pieces of input data to where the driver circuit outputs a plurality of output signals that makes the transition state to be transition (1).
Figure 22:
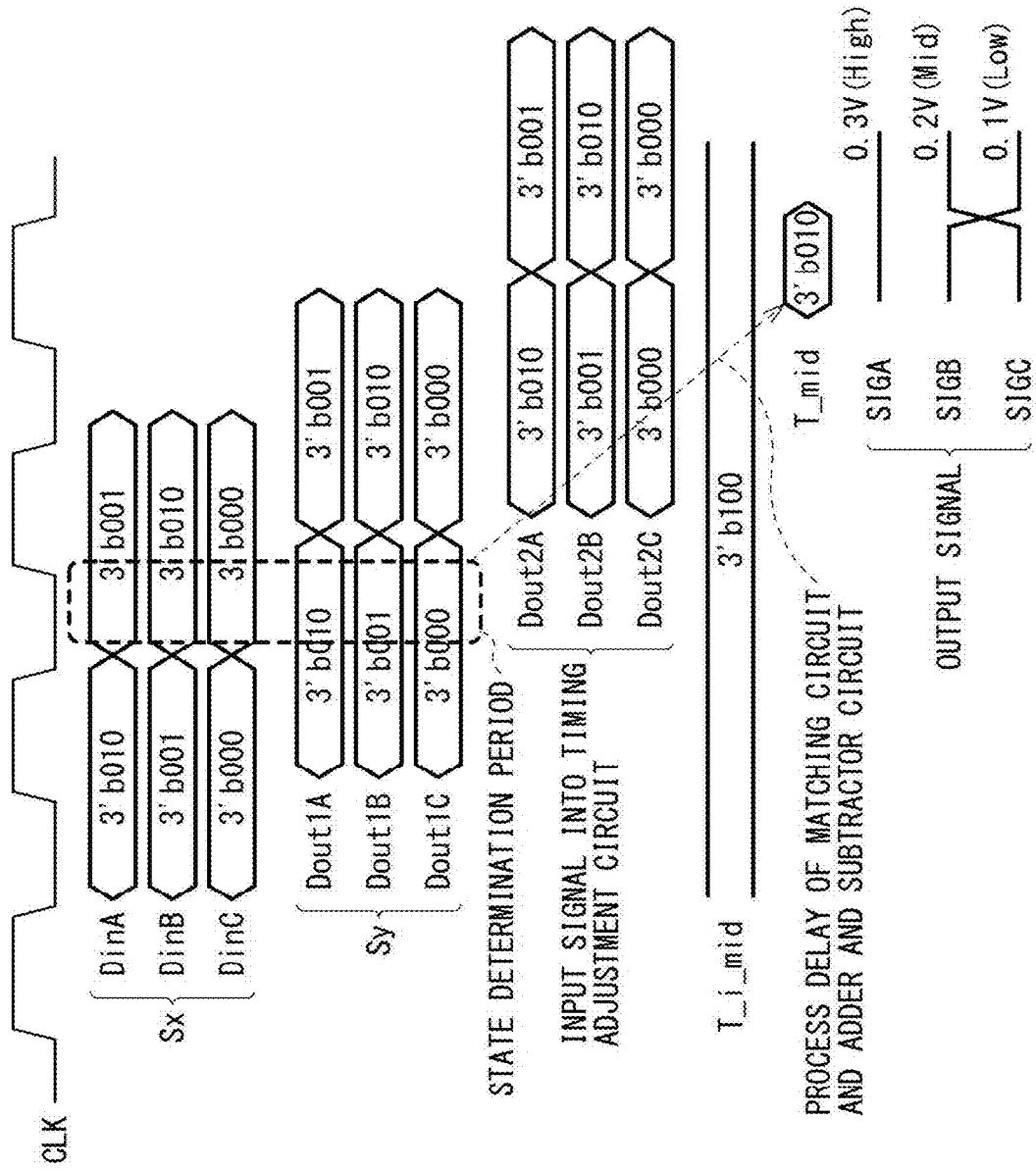
FIG. 22 is a timing chart illustrating a flow of a series of operations from where the transmission device illustrated in FIG. 17 is provided with pieces of input data to where the driver circuit outputs the plurality of output signals that makes the transition state to be transition (3).

FIG. 21 is a timing chart illustrating a flow of a series of operations from where the transmission device illustrated in FIG. 17 is provided with pieces of input data to where the driver circuit 50 outputs the plurality of output signals SIGA, SIGB, and SIGC that makes the transition state to be transition (1) (see FIG. 10). FIG. 22 is a timing chart illustrating a flow of a series of operations from where the transmission device illustrated in FIG. 17 is provided with pieces of input data to where the driver circuit outputs the plurality of output signals SIGA, SIGB, and SIGC that makes the transition state to be transition (3) (see FIG. 10).

It is to be noted that, in FIGS. 21 and 22, only the timing setting signals T_i_mid and T_mid for medium level is illustrated as for the timing setting signal.

In FIGS. 21 and 22, each pieces of input data DinA, DinB, and DinC has a three-bit bit width. The three bits, from the upper bit to the lower bit, correspond to the signals of high level, medium level, and low level that are driven in the driver circuit 50.

It is necessary that the set value of each of the plurality of timing setting signals T_mid, T_up, and T_dn indicating the set value of the timing adjustment circuit 60 be determined before transitions of the plurality of output signals SIGA. SIGB, and SIGC from the driver circuit 50 are completed. In order to satisfy such a timing constraint, in some cases, a delay circuit may be disposed at an appropriate position of the path of the signal subsequent to the synchronization circuit 61, for example. For the delay circuit, for example, a signal such as an inverter chain may be intentionally delayed for a certain period of time.

The set value of each of the plurality of timing setting signals T_mid, T_up, and T_dn is set in such a manner that the common mode noise is minimized in each of the transition states of transitions (1) to (5) illustrated in FIG. 10. That is, the respective set values of the plurality of timing setting signals T_mid, T_up, and T_dn are set values that set the respective input timings of the plurality of driver input signals to the driver circuit 50 which makes it possible to minimize the common mode noise caused by the plurality of output signals SIGA. SIGB, and SIGC.

For example, when the output signal SIGA is driven to medium level in transition (1), the setting of the timing adjustment circuit 60 that determines the operation timing of the driver input signal A_mid is T_mid <2:0>=3'b011 as illustrated in FIG. 21. In contrast, when the output signal SIGB is driven to medium level in transition (3), the setting of the timing adjustment circuit 60 that determines the operation timing of the driver input signal B_mid is T_mid <2:0>=3'b010 as illustrated in FIG. 22.

As described above, the technology of the present disclosure sets the optimum input timings of the driver input signals in accordance with the transition states, even if the transiting signal levels are the same for the plurality of output signals SIGA, SIGB, and SIGC from the driver circuit 50. Thus, the technology of the present disclosure does not set the timing settings to fixed values, but dynamically changes the timing settings. In this way, the common mode noise in each transition state is minimized.

Configuration Example of Timing Adjustment Circuit 60

Figure 23:
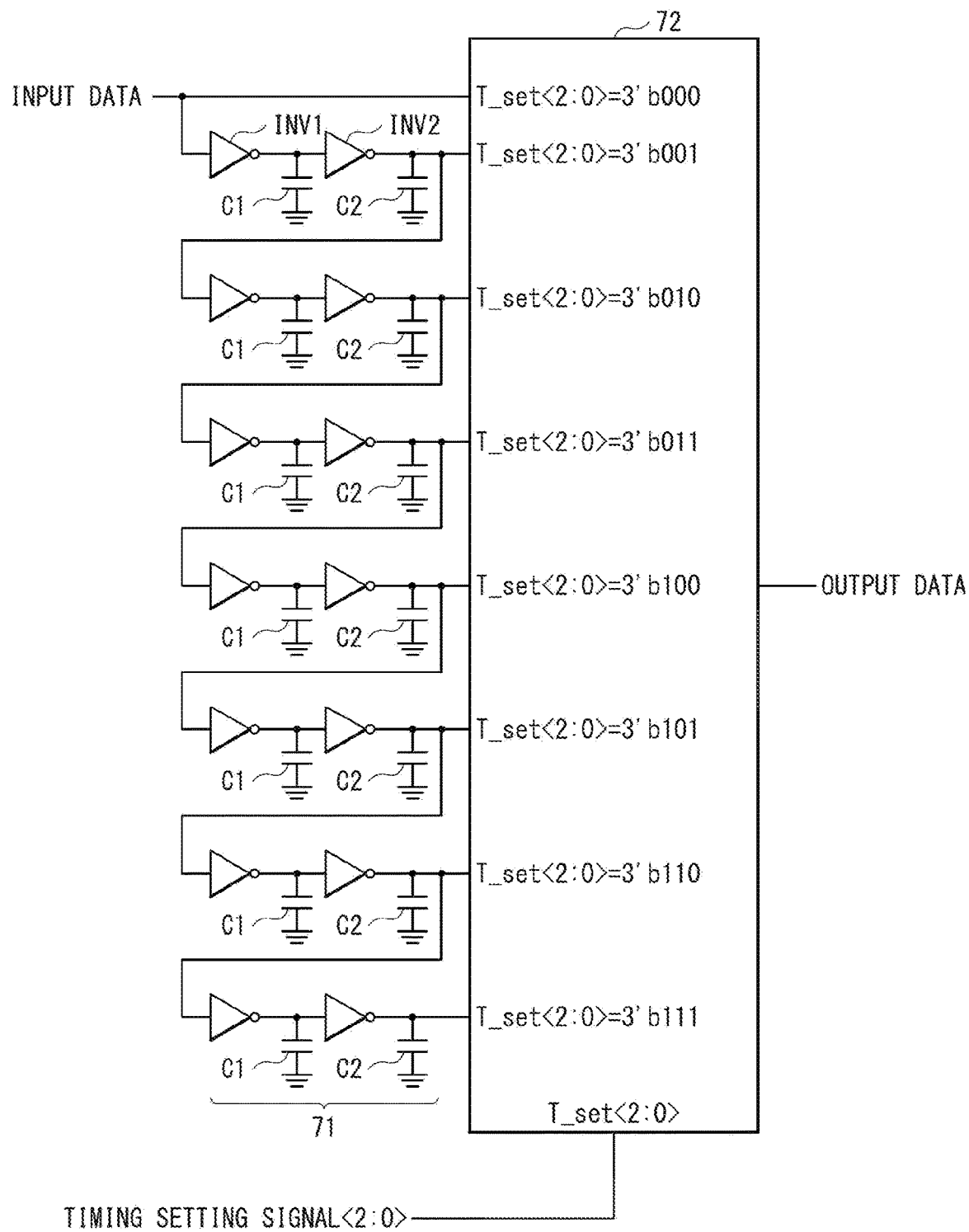
FIG. 23 is a circuit diagram illustrating a specific configuration example of a timing adjustment circuit illustrated in FIG. 17.

FIG. 23 illustrates a specific configuration example of the timing adjustment circuit 60 illustrated in FIG. 17.

The timing adjustment circuit 60 is configured to appropriately delay the output data from the input data in accordance with the timing setting, and includes, for example, an inverter delay circuit 71 and a ⅛ selector circuit 72.

The inverter delay circuit 71 is a delay circuit that generates a plurality of delay signals obtained by delaying signals corresponding to the driver input signals. The inverter delay circuit 71 has a configuration in which a plurality of inverters INV1 and INV2 is chain-coupled. Respective one ends of a plurality of load capacities C1 and C2 are respectively coupled to the plurality of inverters INV1 and INV2. The plurality of inverters INV1 and INV2 includes respective MOS transistors.

The ⅛ selector circuit 72 is a selector circuit that selects any one delay signal out of the plurality of delay signals from the inverter delay circuit 71 on the basis of the timing setting signal, and outputs the selected delay signal as the driver input signal.

It is possible to control the process delay of the inverter delay circuit 71 by adjusting a size of the MOS transistor used for the plurality of inverters INV1 and INV2 included in the inverter delay circuit 71, or by adjusting a size of each of the plurality of load capacities C1 and C2 coupled to the plurality of inverters INV1 and INV2. By either of these measures, it is possible to configure the timing adjustment circuit 60 that is able to control the delay amount. It is possible to select the plurality of delay signals from the inverter delay circuit 71 by the ⅛ selector circuit 72 and to select the signal having an appropriate delay amount.

Figure 24:
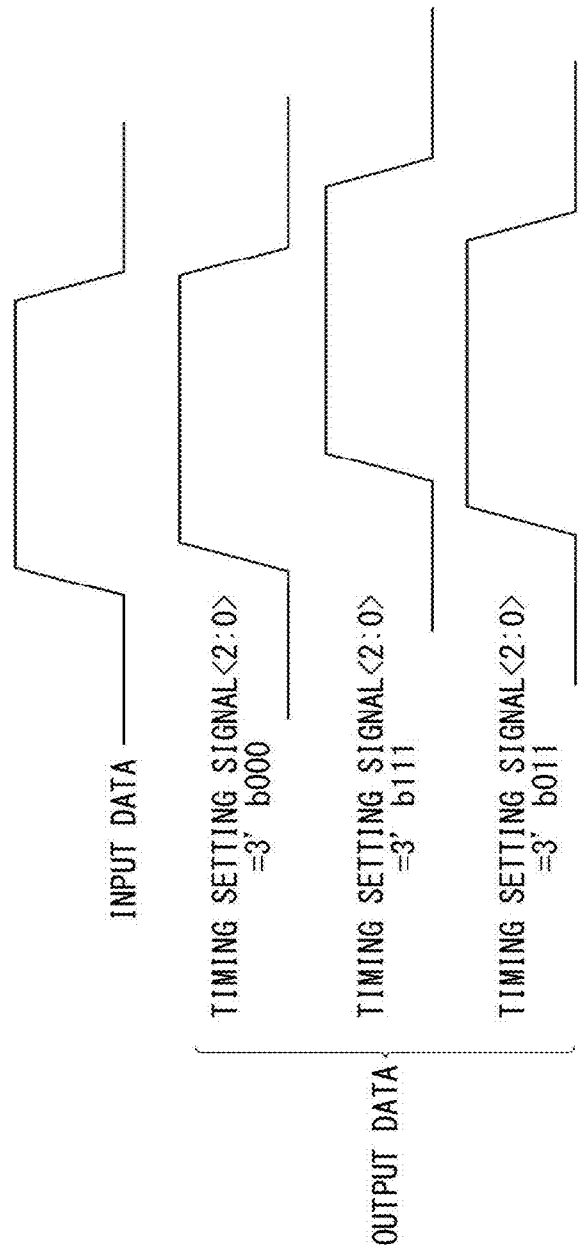
FIG. 24 is a timing chart illustrating an example of operation timings in the timing adjustment circuit illustrated in FIG. 23.

FIG. 24 is a timing chart illustrating an example of operation timings in the timing adjustment circuit 60 illustrated in FIG. 23.

The timing chart of FIG. 24 illustrates an example of operation timings in which timing setting signals each having a three-bit bit width are used as the plurality of timing setting signals T_up, T_mid, and T_dn. As an example, for each of the plurality of timing setting signals T_up, T_mid, and T_dn, an operation timing of a case where the delay is the shortest, an operation timing of a case where the delay is the longest, and an operation timing of a case where the delay is approximately the middle therebetween are illustrated.

Figure 25:
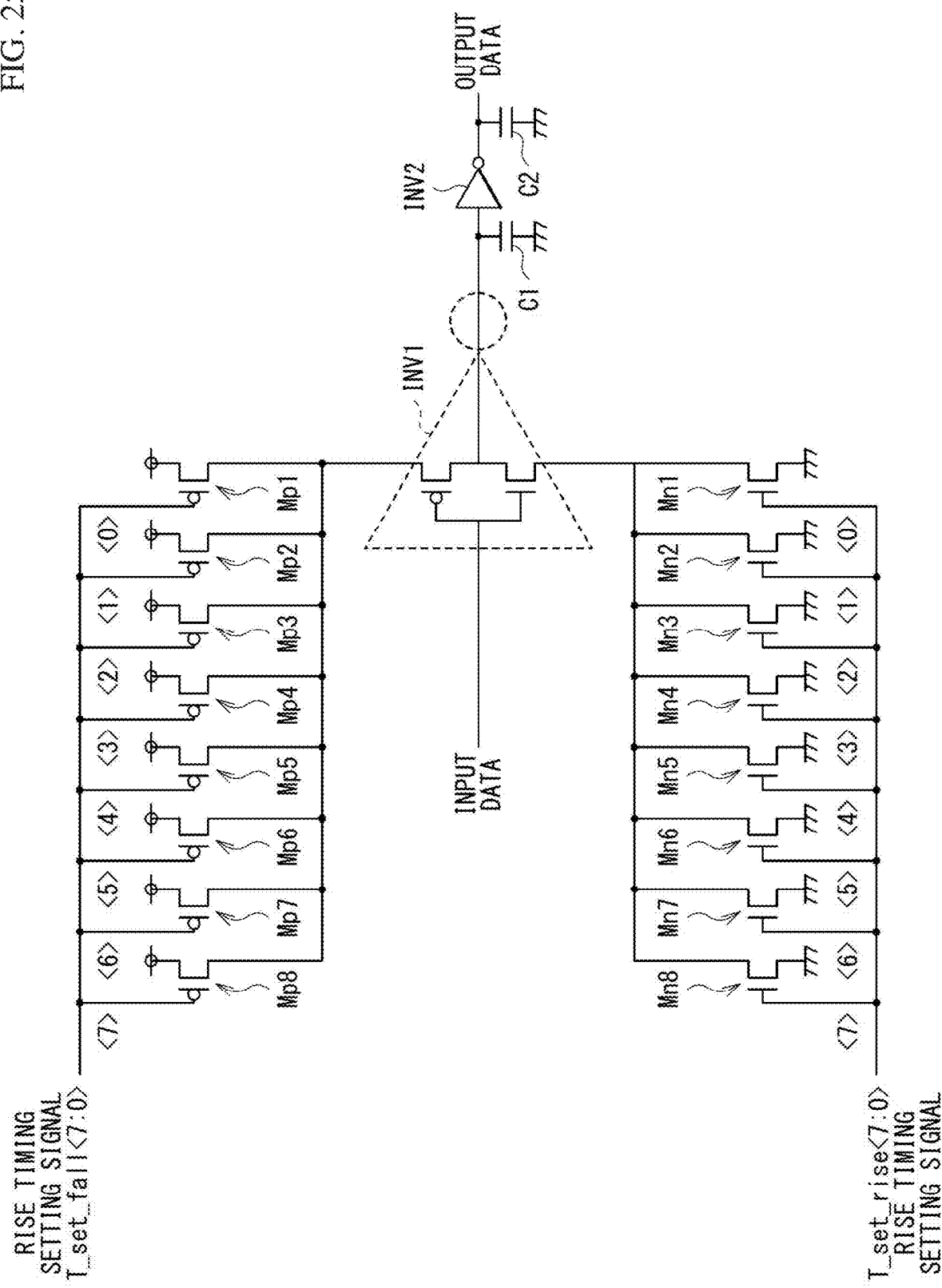
FIG. 25 is a circuit diagram illustrating a modification example of a timing adjustment circuit.

FIG. 25 illustrates a modification example of the timing adjustment circuit 60.

Each of the plurality of timing setting signals T_up, T_mid, and T_dn may include a rise timing setting signal T_set_rise and a fall timing setting signal T_set_fall. Each of the plurality of timing adjustment circuits 60 may be able to adjust a rising timing and a falling timing of each of the plurality of driver input signals on the basis of the rise timing setting signal T_set_rise and the fall timing setting signal T_set_fall. The synchronization circuit 61 and the state determination circuit 63 serving as the control circuit may change respective set values of the rise timing setting signal T_set_rise and the fall timing setting signal T_set_fall to values corresponding to the plurality of transition states.

In a case where the timing adjustment circuit 60 has a function of adjusting the rising timing and the falling timing, the configuration illustrated in FIG. 25 may be employed. In FIG. 25, the fall timing setting signal T_set_fall and the rise timing setting signal T_set_rise are each a signal having an eight-bit bit-width.

In the configuration illustrated in FIG. 25, a plurality of MOS transistors Mp1, Mp2, Mp3, Mp4, Mp5, Mp6, Mp7, and Mp8 each including a P-ch MOSFET is provided in order to adjust the falling timing. Further, a plurality of MOS transistors Mn1, Mn2, Mn3, Mn4, Mn5, Mn6, Mn7, and Mn8 each including an N-ch MOSFET are provided in order to adjust the rising timing. The fall timing setting signal T_set_fall and the rise timing setting signal T_set_rise are each an eight-bit signal. Thus, eight P-ch MOSFETs and eight N-ch MOSFETs are used. One or more of the plurality of MOS transistors Mp1, Mp2, Mp3, Mp4, Mp5, Mp6, Mp7, and Mp8 and the plurality of MOS transistors Mn1, Mn2, Mn3, Mn4, Mn5, Mn6, Mn7, and Mn8 are in an on state in any timing setting. A size of MOSFET is changed in accordance with the fall timing setting signal T_set_fall and the rise timing setting signal T_set_rise. This makes it possible to control the process delay of the inverters INV1 and INV2, and to individually control the rising timing and the falling timing of the signal. In this case, the number of MOSFETs to be turned into an on state may be two or more, or only one. Here, it is important to adjust the size of the MOSFET to be turned into an on state, in accordance with the fall timing setting signal T_set_fall and the rise timing setting signal T_set_rise.

Simulation of Common Mode Noise

Figure 26:
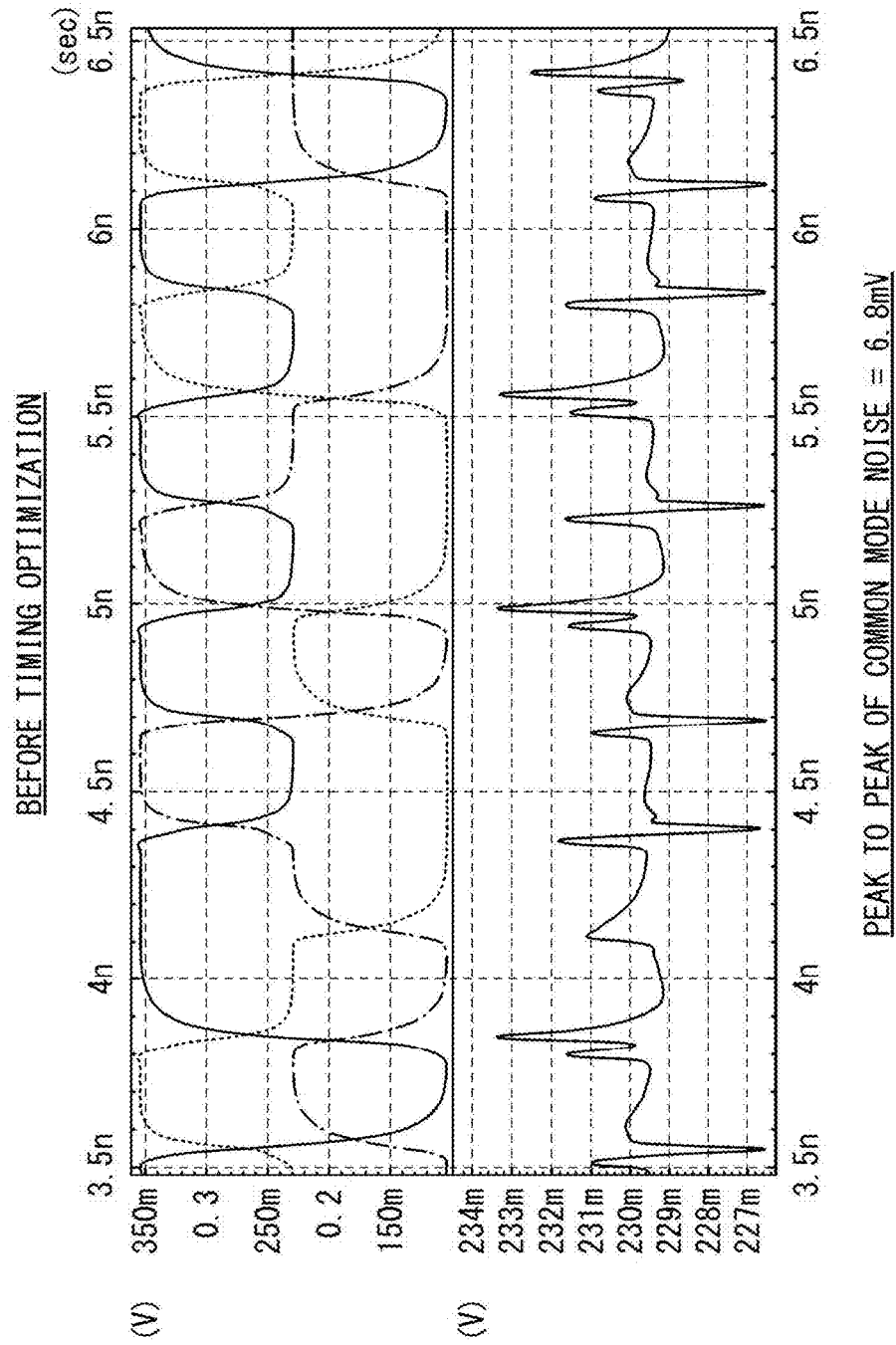
FIG. 26 is a timing chart illustrating an example of a result of simulating operation timings of a plurality of output signals from the driver circuit and an occurrence timing of common mode noise before performing timing adjustment by the timing adjustment circuits, in the transmission device according to the first embodiment.
Figure 27:
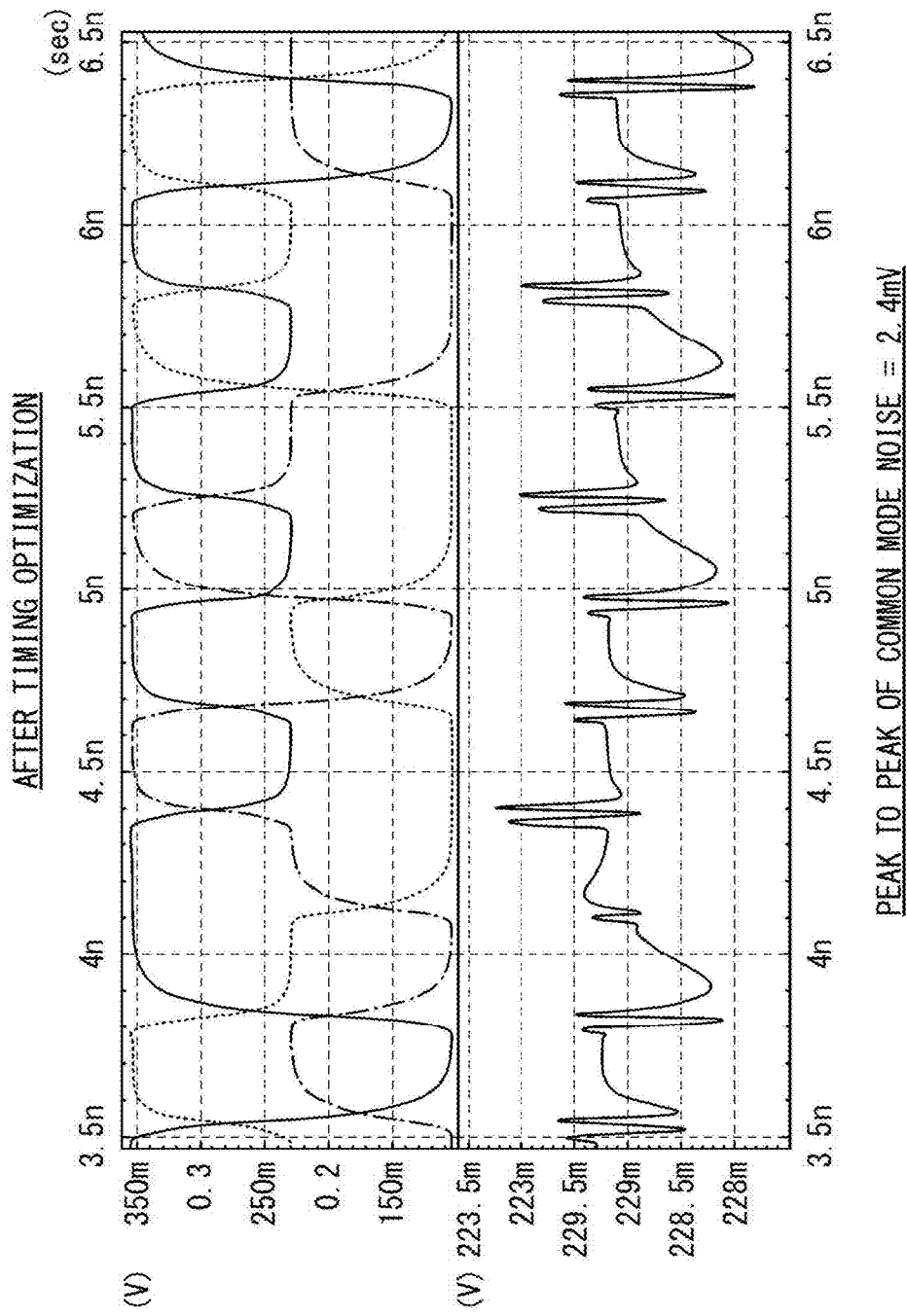
FIG. 27 is a timing chart illustrating an example of a result of simulating the operation timings of the plurality of output signals from the driver circuit and the occurrence timing of the common mode noise after performing the timing adjustment by the timing adjustment circuits, in the transmission device according to the first embodiment.

FIG. 26 is a timing chart illustrating an example of a result of simulating operation timings of the plurality of output signals SIGA, SIGB, and SIGC from the driver circuit 50 and an occurrence timing of common mode noise before performing the timing adjustment by the timing adjustment circuits 60, in the transmission device according to the first embodiment. FIG. 27 is a timing chart illustrating an example of a result of simulating the operation timings of the plurality of output signals SIGA, SIGB, and SIGC from the driver circuit 50 and the occurrence timing of the common mode noise after performing the timing adjustment by the timing adjustment circuits 60, in the transmission device according to the first embodiment. In each of FIGS. 26 and 27, the upper row indicates the operation timings of the plurality of output signals SIGA, SIGB, and SIGC, and the lower row indicates the occurrence timing of the common mode noise.

FIG. 26 is the result of simulating a case where the input timings of the plurality of driver input signals are set to fixed values regardless of the transition state of the plurality of output signals SIGA, SIGB, and SIGC. FIG. 27 is the simulation result in which the set values of the respective input timings of the plurality of driver input signals are dynamically varied in accordance with the transition state of the plurality of output signals SIGA, SIGB, and SIGC, and the input timings are optimized. As compared with the case where the input timings are not optimized (FIG. 26), it is appreciated that the common mode noise is reduced to half or less in the case where the input timings are optimized (FIG. 27).

1.2 Example of Application to Electronic Apparatus

Application Example 1

Figure 28:
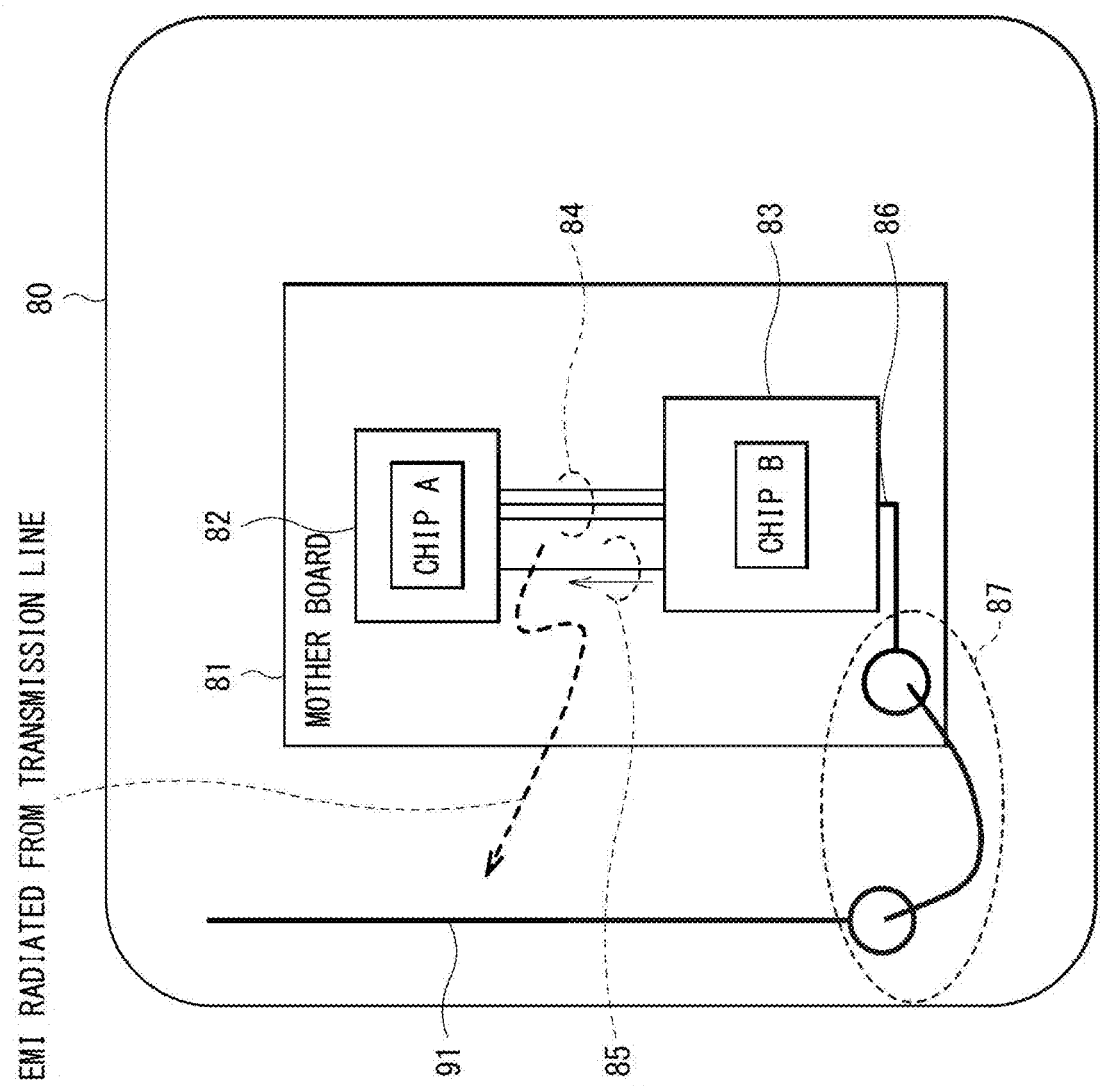
FIG. 28 is a configuration diagram illustrating an example of applying the transmission device according to the first embodiment to an electronic apparatus.

FIG. 28 is an example of applying the transmission device according to the first embodiment to an electronic apparatus. FIG. 28 illustrates a configuration example of an electronic device system 80 having wireless capabilities as an example of the electronic apparatus.

The electronic device system 80 includes a transmission device 82, a reception device 83, and an antenna 91. The transmission device 82 and the reception device 83 are coupled to each other by: a differential signal transmission line 84 that transmits a differential signal between the transmission device 82 and the reception device 83; and a control signal transmission line 85 that transmits a control signal from the reception device 83 to the transmission device 82. The reception device 83 and the antenna 91 are coupled to each other by an antenna reception signal wiring line 86, and a cable, a connector, or the like 87.

The transmission device 82, the reception device 83, the differential signal transmission line 84, the control signal transmission line 85, and the antenna reception signal wiring line 86 are provided on a mother board 81.

The antenna 91 receives a radio signal and outputs the radio signal to the reception device 83 as a reception signal. The transmission device 82 transmits a differential signal. The reception device 83 receives the differential signal transmitted from the transmission device 82 and the reception signal from the antenna 91. The transmission device 82 includes a circuit CHIP A as a circuit for transmitting the differential signal. The reception device 83 includes a circuit CHIP B as a circuit for receiving the differential signal. The circuit CHIP A is provided with the circuits of the transmission device according to the first embodiment described above.

In the electronic device system 80, due to common mode noise of the differential signal to be transmitted from the circuit CHIP A of the transmission device 82, radiation noise radiated from the differential signal transmission line 84 becomes EMI and is coupled to the antenna 91. The antenna 91 receives radio waves of weak radio signals from the outside. Thus, if EMI from the differential signal transmission line 84 is coupled to the radio waves, it becomes difficult to receive the external radio waves. In other words, radio sensitivity degradation occurs.

Application of the technology of the transmission device according to the first embodiment described above to the electronic device system 80 makes it possible to solve the above-described issue.

The reception device 83 transmits a timing control signal to the transmission device 82 via the control signal transmission line 85. The timing control signal controls a set value of the above-described timing setting signal in the transmission device 82 in such a manner that a state of the reception signal from the antenna 91 becomes a desired state. The reception device 83 generates the timing control signal on the basis of a level of antenna coupled noise generated by the radiation noise radiated from the transmission line 85 being coupled to the antenna 91, or a state (such as a magnitude) of the radio sensitivity of the antenna 91.

The transmission device 82 changes the set value of the timing setting signal of the timing adjustment circuit 60 to suppress the common mode noise, on the basis of the timing control signal from the reception device 83. The timing setting signal used here refers to the plurality of timing setting signals T_i_dn, T_i_mid, and T_i_up illustrated in FIG. 17.

After changing the timing setting of the timing adjustment circuit 60 in the transmission device 82, the reception device 83 determines again the level of the antenna coupled noise or the state of the radio sensitivity of the antenna 91. As described above, every time the timing setting of the timing adjustment circuit 60 is changed in the transmission device 82, the reception device 83 performs the above-described determination, and derives the set value of the timing setting in such a manner that the state of the reception signal from antenna 91 becomes the best. Lastly, a command indicated by the timing control signal from the reception device 83 causes the optimum setting to be applied to the transmission device 82.

FIG. 29 is a flowchart illustrating an example of an operation of controlling the set values of the timing setting signals of the transmission device 82 in the electronic apparatus according to the first embodiment.

First, the common mode noise is generated from the transmission device 82 (step S11). Thereafter, EMI is radiated from the differential signal transmission line 84 and coupled to the antenna 91 (step S12). Thereafter, the reception device 83 determines the state of the antenna coupled noise (or radio sensitivity degradation) (step S13).

Thereafter, the reception device 83 determines whether or not the antenna coupled noise is minimum or determines whether or not the radio sensitivity degradation is minimum (step S14). If it is determined that the antenna coupled noise is not minimum or that the radio sensitivity degradation is not minimum (step S14: N), the reception device 83 performs control to change the timing setting of the transmission device 82 by transmitting the timing control signal to the transmission device 82 (step S15), and the process returns to step S11. If it is determined that the antenna coupled noise is minimum or the radio sensitivity degradation is minimum (step S14: Y), the reception device 83 sets the setting to be minimum on the transmission device 82 by transmitting the timing control signal to the transmission device 82 (step S16), and the process ends.

As described above, application of the technology of the transmission device according to the first embodiment described above to the electronic device system 80 makes it possible to automatically minimize EMI in an actual device operation of the electronic device system 80.

Application Example 2

FIG. 30 illustrates an example of radio bands to be used by the electronic apparatus according to the first embodiment. FIG. 31 illustrates an example of a relationship between the radio bands to be used by the electronic apparatus according to the first embodiment and a spectrum characteristic of EMI that occurs in the electronic apparatus.

As illustrated in FIG. 30, a radio system generally uses a plurality of radio bands A, B, and C in many cases. Hereinafter, a case where the electronic device system 80 having the configuration illustrated in FIG. 28 described above uses the plurality of radio bands A, B, and C illustrated in FIG. 30 will be described.

In a case where the operation of the transmission device 82 causes EMI in the electronic device system 80, and if EMI has a spectrum characteristic as illustrated in FIG. 31, for example, a spectrum B' and a spectrum C' of EMI respectively overlap with the radio band B and the radio band C. The antenna 91, serving as a radio device that uses the radio band B and the radio band C, may be deteriorated in sensitivity due to such spectrum B' and spectrum C'.

To avoid this, the transmission device 82 may be provided with a function of being able to change operation frequency. The changing of the operation frequency may be performed by transmitting an operation control signal from the reception device 83 via the control signal transmission line 85.

The transmission device 82 may be provided with a function of being able to change the operation frequency of the transmission device 82 in such a manner that the state of the reception signal from the antenna 91 becomes a desired state on the basis of the operation control signal from the reception device 83. The reception device 83 may: generate the operation control signal on the basis of a level of antenna coupled noise generated by the radiation noise caused by the operation of the transmission device 82 being coupled to the antenna 91, or a state (such as a magnitude) of the radio sensitivity of the antenna 91; and transmit the operation control signal to the transmission device 82. In this way, the changing of the operation frequency is performed in such a manner that the radio characteristic becomes optimum.

FIG. 32 illustrates an example of a relationship between the spectrum characteristic of EMI and the radio bands after changing the operation frequency of the transmission device 82 in the electronic apparatus according to the first embodiment. Changing the operation frequency of the transmission device 82 makes it easier to prevent the spectra of EMI caused by the operation of the transmission device 82 from being overlapped with the respective radio bands, as illustrated in FIG. 32, for example. In some cases, the radio band A and the radio band B do not overlap with spectra of EMI, but the radio band C may overlap with a spectrum of EMI; however, whether this is acceptable or not is to be determined by the radio system. For example, the determination may be performed on the basis of a radio sensitivity characteristic.

It is to be noted that examples of EMI caused by the operation of the transmission device 82 include the following.
  Common mode noise that occurs when the transmission device 82 transmits the differential signal.
  Switching noise that occurs when the circuit CHIP A of the transmission device 82 operates. This means that a steep current flows by switching to a power supply line to be supplied to the circuit CHIP A, and EMI is radiated from the power supply line. The power supply line refers to all power supply lines wired in power supply wiring lines in the circuit CHIP A, semi-conductor packages, and printed boards.

FIG. 33 illustrates an example of settable frequency of the operation frequency of the transmission device 33 in the electronic apparatus according to the first embodiment.

FIG. 33 is an example of a case where the circuit CHIP A of the transmission device 33 includes a circuit block A and a circuit block B, and operation frequency of each circuit block is represented by a scale factor with respect to basic operation frequency. In a case where the settable frequency held by the circuit CHIP A of the transmission device 33 is, for example, as illustrated in FIG. 33, operation frequency setting of each of the circuit block A and the circuit block B may be performed, and the setting with the best radio characteristic may be selected and used.

For example, it is assumed that the setting 24 is the setting with the best radio characteristic. In a case where the basic operation frequency of the circuit block A is 200 MHz and the basic operation frequency of the circuit block B is 300 MHz, on the basis of this setting, the operation frequency of the circuit block A is 240 MHz and the operation frequency of the circuit block B is 330 MHz. It is to be noted that it becomes possible to change the operation frequency in the circuit CHIP A by, specifically speaking, using a frequency division circuit or the like.

FIG. 34 is a flowchart illustrating an example of an operation of controlling the operation frequency of the transmission device 82 in the electronic apparatus according to the first embodiment.

First, the circuit CHIP A of the transmission device 82 operates and noise is generated (step S21). Thereafter, EMI is radiated from the differential signal transmission line 84 and coupled to the antenna 91 (step S22). Thereafter, the reception device 83 determines the state of the antenna coupled noise (or radio sensitivity degradation) (step S23).

Thereafter, the reception device 83 determines whether or not the antenna coupled noise is minimum or determines whether or not the radio sensitivity degradation is minimum (step S24). If it is determined that the antenna coupled noise is not minimum or that the radio sensitivity degradation is not minimum (step S24: N), the reception device 83 performs control to change the operation frequency setting of the circuit CHIP A of the transmission device 82 by transmitting the operation control signal to the transmission device 82 (step S25), and the process returns to step S21. If it is determined that the antenna coupled noise is minimum or the radio sensitivity degradation is minimum (step S24. Y), the reception device 83 sets the setting to be minimum on the transmission device 82 by transmitting the operation control signal to the transmission device 82 (step S26), and the process ends.

It is to be noted that the radio characteristic is graspable by the reception device 83, and the determination as to whether or not the radio characteristic is in the optimum state is thus performed by the reception device 83 in the above explanation; however, whether or not the radio characteristic is in the optimum state may be determined by the transmission device 82. In this case, information of the radio characteristic may be transmitted from the reception device 83 to the transmission device 82, and the transmission device 82 may determine whether or not the radio characteristic is in the optimum state.

1.3 Modification Example

FIG. 35 illustrates a configuration example of a main part of a transmission device according to a modification example of the first embodiment.

In the above description, as the transmission device according to the first embodiment, the case of outputting the four-valued differential signal is exemplified; however, technology according to the present disclosure is also applicable to a case where a differential signal other than the four-valued differential signal is to be outputted. FIG. 35 illustrates a configuration example of a transmission device that outputs a two-valued differential signal.

In the transmission device illustrated in FIG. 35, a timing adjustment circuit 160UA and a timing adjustment circuit 160DA are respectively disposed in the preceding stages of the rise circuit 141U and the fall circuit 141D in the pre-driver circuit 140 of the output circuit 101A in the transmission device according to the comparative example illustrated in FIG. 1. Further, a timing adjustment circuit 160UB and a timing adjustment circuit 160DB are respectively disposed in the preceding stages of the rise circuit 141U and the fall circuit 141D in the pre-driver circuit 140 of the output circuit 101B.

The timing adjustment circuit 160UA adjusts the input timing of the driver input signal UIN_A on the basis of a timing setting signal T_UA. The timing adjustment circuit 160DA adjusts the input timing of the driver input signal DIN_A on the basis of a timing setting signal T_DA. The timing adjustment circuit 160UB adjusts the input timing of the driver input signal UIN_B on the basis of a timing setting signal T_UB. The timing adjustment circuit 160DB adjusts the input timing of the driver input signal DIN_B on the basis of a timing setting signal T_DB.

Further, in the driver circuit 150, the rise circuit 151U of the output circuit 101A includes a MOS transistor M_UA and the resistor R1, and the rise circuit 151D of the output circuit 101A includes a MOS transistor M_DA and the resistor R2. In the driver circuit 150, the rise circuit 151U of the output circuit 101B includes a MOS transistor M_UB and the resistor R1, and the rise circuit 151D of the output circuit 101B includes a MOS transistor M_DB and the resistor R2. Each of the MOS transistors M_UA, M_DA, M_UB, and M_DB includes an N-ch MOSFET.

In the driver circuit 150 illustrated in FIG. 35, for example, in a case where a manufacturing variability occurs in each of the MOS transistors M_UA, M_DA, M_UB, and M_DB, a difference occurs between operation speeds of the MOSFETs. In this case, a timing difference occurs between the output signals SIGA and SIGB, resulting in that the common mode noise increases.

Accordingly, by independently controlling the timing settings by the plurality of timing adjustment circuits 160UA, 160DA, 160UB, 160DB on the basis of the plurality of timing setting signals T_UA, T_DA, T_UB, and T_DB, respectively, it is possible to minimize the common mode noise even in the case where the manufacturing variability occurs in each of the MOS transistors M_UA, M_DA, M_UB, and M_DB.

1.4 Effects

As described above, the transmission device and the electronic apparatus according to the first embodiment change the set values of the timing setting signals for the respective plurality of timing adjustment circuits 60 to the values corresponding to the plurality of transition states of the possible signal levels of each of the plurality of output signals to be outputted from the driver circuit. This makes it possible to minimize the common mode noise in each of the plurality of transition states, and to improve the communication performance.

Further, according to the electronic apparatus of the first embodiment, the technology of the present disclosure is applied to the electronic device system 80 having wireless capabilities. This also makes it possible to minimize the common mode noise to be outputted from the transmission device in an actual device state.

It is to be noted that the effects described in this description are merely illustrative and non-limiting, and other effects may be also provided. The same applies to the effects of the other embodiments.

2. Second Embodiment

Next, a transmission device according to a second embodiment of the present disclosure will be described. It is to be noted that, in the following description, the same reference signs are given to components substantially the same as the components of the transmission device according to the first embodiment described above, and the description thereof is omitted as appropriate.

FIG. 36 illustrates a configuration example of a main part of the transmission device according to the second embodiment. FIG. 37 illustrates an example of transition between symbols that the transmission device according to the second embodiment transmits.

FIG. 36 illustrates a configuration example of the output unit 30A as a main part of the transmission device illustrated in FIG. 16. The output unit 30A illustrated in FIG. 36 includes an output controller 31, drivers 32A, 32B, and 32C, delay units 33A, 33B, and 33C, and a controller 39.

The transmission device illustrated in FIG. 16 may transmit six symbols, "+x", "−x", "+y", "−y", "+z", and "−z", using three output signals SIGA, SIGB, and SIGC. For example, in a case of transmitting the symbol "+x", the transmission device sets the output signal SIGA to high-level voltage VH, sets the output signal SIGB to low-level voltage VL, and sets the output signal SIGC to medium-level voltage VM. In a case of transmitting the symbol "−x", the transmission device sets the output signal SIGA to low-level voltage VL, sets the output signal SIGB to high-level voltage VH, and sets the output signal SIGC to medium-level voltage VM. In a case of transmitting the symbol "+y", the transmission device sets the output signal SIGA to medium-level voltage VM, sets the output signal SIGB to high-level voltage VH, and sets the output signal SIGC to low-level voltage VL. In a case of transmitting the symbol "−y", the transmission device sets the output signal SIGA to medium-level voltage VM, sets the output signal SIGB to low-level voltage VL, and sets the output signal SIGC to high-level voltage VH. In a case of transmitting the symbol "+z", the transmission device sets the output signal SIGA to low-level voltage VL, sets the output signal SIGB to medium-level voltage VM, and sets the output signal SIGC to high-level voltage VH. In a case of transmitting the symbol "−z", the transmission device sets the output signal SIGA to high-level voltage VH, sets the output signal SIGB to medium-level voltage VM, and sets the output signal SIGC to low-level voltage VL.

FIG. 37 illustrates an example of an operation of the signal generator 15 in the transmission device illustrated in FIG. 16. The example of FIG. 37 illustrates the six symbols "+x", "−x", "+y", "−y", "+z", and "−z", and transitions therebetween.

In the transmission device illustrated in FIG. 16, the signal TxF causes the symbol to make a transition between "+x" and "−x", causes the symbol to make a transition between "+y" and "−y", and causes the symbol to make a transition between "+z" and "−z". Specifically, in a case where the signal TxF is "1", the transition is made so as to change the polarity of the symbol (for example, from "+x" to "−x"), and in a case where the signal TxF is "0", such a transition is not made.

In the case where the signal TxF is "0", the signals TxR, TxP cause the symbol to make a transition between "+x" and other than "+x", between "+y" and other than "+y", and between "+z" and other than "+z". Specifically, in a case where the signals TxR, TxP are "1", "0", the symbol makes a transition in a clockwise direction in FIG. 37 while maintaining the polarity of the symbol (for example, from "+x" to "+y"), and in a case where the signals TxR. TxP are "1", "0", the symbol changes the polarity thereof and makes a transition in the clockwise direction in FIG. 37 (for example, from "+x" to "−y"). Further, in a case where the signals TxR, TxP are "0", "0", the symbol makes a transition in a counterclockwise direction in FIG. 37 while maintaining the polarity of the symbol (for example, from "+x" to "+z"), and in a case where the signals TxR, TxP are "0", "1", the symbol changes the polarity thereof and makes a transition in the counterclockwise direction in FIG. 37 (for example, from "+x" to "−z").

In this way, in the signal generator 15, the signal TxF, TxR, TxP specify the direction of the transition of the symbol. Thus, the signal generator 15 is able to determine the next symbols NS on the basis of the current symbols CS and the signals TxF, TxR, and TxP. The signal generator 15 then supplies the symbols NS to the flip-flop 16 using the three-bit signal S1 in this example.

The output unit 30A illustrated in FIG. 37 generates the plurality of output signals SIGA, SIGB, and SIGC on the basis of the signal S2. The operation of the output unit 30A is controlled by the control signal IT1.

The driver 32A sets a voltage state of the output signal SIGA to one of three voltage levels (high-level voltage VH, medium-level voltage VM, and low-level voltage VL) on the basis of a control signal supplied from the output controller 31 via the delay unit 33A. The driver 32B sets a voltage state of the output signal SIGB to one of the three voltage levels on the basis of a control signal supplied from the output controller 31 via the delay unit 33B. The driver 32C sets a voltage state of the output signal SIGC to one of the three voltage levels on the basis of a control signal supplied from the output controller 31 via the delay unit 33C.

With this configuration, the output unit 30A is able to set the output signals SIGA, SIGB, and SIGC to three voltage levels corresponding to the symbols CS on the basis of the symbols CS indicated by the signal S2.

Next, the driver 32A of the output unit 30 will be described in more detail. It is to be noted that the same applies to the drivers 32B and 32C.

The driver 32A includes transistors 35 and 36 and resistors 37 and 38. The transistors 35 and 36 each include an N-ch MOSFET. A gate of the transistor 35 is supplied with the control signal from the output controller 31 to via the delay unit 33A, a drain of the transistor 35 is supplied with a voltage V1, and a source of the transistor 35 is coupled to one end of the resistor 37. A gate of the transistor 36 is supplied with the control signal from the output controller 31 via the delay unit 33A, a drain of the transistor 36 is coupled to one end of the resistor 38, and a source of the transistor 36 is grounded. The resistors 37 and 38 each serves as a termination resistor. One end of the resistor 37 is coupled to the source of the transistor 35, and the other end of the resistor 37 is coupled to the other end of the resistor 38 and is also coupled to the output terminal ToutA. One end of the resistor 38 is coupled to the drain of the transistor 36, and the other end of the resistor 38 is coupled to the other end of the resistor 37 and is also coupled to the output terminal ToutA.

For example,
in a case where the output signal SIGA is to be set to high-level voltage VH, the output controller 31 supplies the control signal of high level to the transistor 35 and the control signal of low level to the transistor 36.
As a result, the transistor 35 is turned on, the transistor 36 is turned off, an output current flows through the transistor 35, and the output signal SIGA is set to high-level voltage VH. Further, for example,
in a case where the output signal SIGA is to be set to low-level voltage VL, the output controller 31 supplies the control signal of low level to the transistor 35 and the control signal of high level to the transistor 36.
As a result, the transistor 35 is turned off, the transistor 36 is turned on, the output current flows through the transistor 36, and the output signal SIGA is set to low-level voltage VL. Further, for example,
in a case where the output signal SIGA is to be set to medium-level voltage VM, the output controller 31 supplies the control signal of low level to the transistors 35 and 36.
As a result, the transistors 35 and 36 are turned off.

The controller 39 controls delay amounts of the delay units 33A, 33B, and 33C on the basis of the control signal IT1.

The delay unit 33A is interposed between the output controller 31 and the driver 32A, delays the two control signals supplied from the output controller 31 on the basis of a delay control signal supplied from the controller 39, and supplies the two control signals to the driver 32A.

The delay unit 33B is interposed between the output controller 31 and the driver 32B, delays the two control signals supplied from the output controller 31 on the basis of a delay control signal supplied from the controller 39, and supplies the two control signals to the driver 32B.

The delay unit 33C is interposed between the output controller 31 and the driver 32C, and delays the two control signals supplied from the output controller 31 on the basis of a delay control signal supplied from the controller 39, and supplies the two control signals to the driver 32C.

It is to be noted that each of the delay units 33A, 33B, and 33C corresponds to the timing adjustment circuit in the transmission device according to the first embodiment. In the transmission device according to the second embodiment illustrated in FIG. 36, the controller 39 performs control corresponding to the transition states of the output signals SIGA, SIGB, and SIGC on the delay amounts of the delay units 33A, 33B, and 33C by technology similar to that of the transmission device according to the first embodiment. This makes it possible to adjust a skew of the output signals SIG1A, SIG1B, and SIG1C, and to suppress the common mode.

Other configurations, operations, and effects may be substantially similar to those of the transmission device according to the first embodiment.

3. Third Embodiment

Next, a transmission device according to a third embodiment of the present disclosure will be described. It is to be noted that, in the following description, the same reference signs are given to components substantially the same as the components of the transmission device according to the first or second embodiment described above, and the description thereof is omitted as appropriate.

Figure 38:
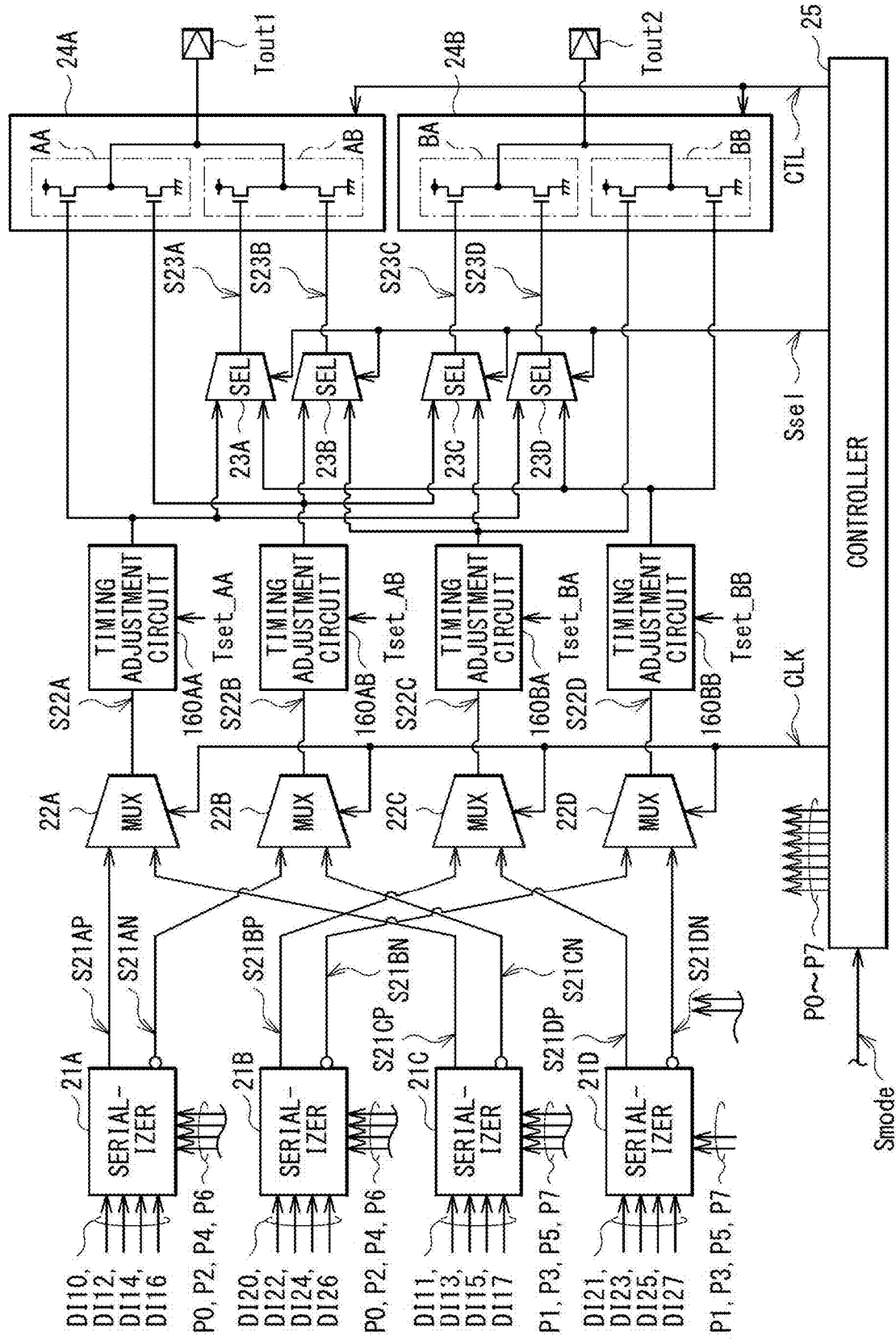
FIG. 38 is a circuit diagram illustrating a configuration example of a main part of a transmission device according to a third embodiment.

FIG. 38 illustrates a configuration example of a main part of the transmission device according to the third embodiment.

The transmission device according to the third embodiment has two operation modes MA and MB. The operation mode MA is a single-phase mode in which a single-phase signal is transmitted, and the operation mode MB is a differential mode in which a differential signal is transmitted. The transmission device transmits data in any one of the two operation modes MA and MB on the basis of a mode signal Smode.

The transmission device includes four serializers 21 (serializers 21A, 21B, 21C, and 21D), four multiplexers (MUXs) 22 (multiplexers 22A, 22B, 22C, and 22D), four selectors (SELs) 23 (selectors 23A, 23B, 23C, and 23D), two drivers 24 (drivers 24A and 24B), and a controller 25.

Further, the transmission device includes a plurality of timing adjustment circuits 160AA, 160AB, 160BA, and 160BB provided in the subsequent stage of the multiplexers 22A, 22B, 22C, and 22D, respectively.

The serializer 21A serializes signals DI10, DI12, DI14, and DI16 on the basis of clock signals P0, P2, P4, and P6, thereby generating signals S21AP and S21AN. The signals S21AP and S21AN are signals that are inverted from each other. Likewise, the serializer 21B serializes signals DI20, DI22, DI24, and DI26 on the basis of clock signals P0, P2, P4, and P6, thereby generating signals S21BP and S21BN. The signals S21BP and S21BN are signals that are inverted from each other. The serializer 21C serializes signals DI11, DI13, DI15, and DI17 on the basis of clock signals P1, P3, P5, and P7, thereby generating signals S21CP and S21CN. The signals S21CP and S21CN are signals that are inverted from each other. The serializer 21D serializes signals DI21, DI23, DI25, and DI27 on the basis of clock signals P1, P3, P5, and P7, thereby generating signals S21DP and S21DN. The signals S21DP and S21DN are signals that are inverted from each other.

In the operation mode MA, the signals DI10, SI11, DI12, DI13, DI14, DI15, DI16, and DI17 are transmitted by using a signal SIG1, and the signals DI20, SI21, DI22, DI23, DI24, DI25, DI26, and DI27 are transmitted by using a signal SIG2.

Further, in the operation mode MB, the signals DI10, SI11, DI12, DI13, DI14, DI15, DI16, and DI17 are transmitted by using signals SIGP and SIGN. Moreover, in this operation mode MB, the signals DI20, SI21, DI22, DI23, DI24, DI25, DI26, and DI27 are used to perform an emphasis operation. As described below, data indicated by these signals DI20 to DI27 is set to be shifted by one bit from data indicated by the signals DI10 to DI17.

The multiplexer 22A alternately selects one of the signals S21AP and S21CP on the basis of a clock signal CLK, and outputs the selected signal as a signal S22A. The multiplexer 22B alternately selects one of the signals S21AN and S21CN on the basis of a clock signal CLK, and outputs the selected signal as a signal S22B. The multiplexer 22C alternately selects one of the signals S21BP and S21DP on the basis of a clock signal CLK, and outputs the selected signal as a signal S22C. The multiplexer 22D alternately selects one of the signals S21BN and S21DN on the basis of a clock signal CLK, and outputs the selected signal as a signal S22D.

The multiplexer 22A selects the signal S21AP in a period in which the clock signal CLK is high level, and selects the signal S21CP in a period in which the clock signal CLK is low level.

In this way, the multiplexer 22A selects the signal S21AP in a period in which the clock signal CLK is high level, and selects the signal S21CP in a period in which the clock signal CLK is low level. Furthermore, the multiplexer 22B selects the signal S21AN in a period in which the clock signal CLK is high level, and selects the signal S21CN in a period in which the clock signal CLK is low level. The signals S21AP and S21AN are signals that are inverted from each other, and the signals S21CP and S21CN are signals that are inverted from each other, and therefore, the output signal S22A of the multiplexer 22A and the output signal S22B of the multiplexer 22B are signals that are inverted from each other.

Likewise, the multiplexer 22C selects the signal S21BP in a period in which the clock signal CLK is high level, and selects the signal S21DP in a period in which the clock signal CLK is low level. Furthermore, the multiplexer 22D selects the signal S21BN in a period in which the clock signal CLK is high level, and selects the signal S21DN in a period in which the clock signal CLK is low level. As described above, the signals S21BP and S21BN are signals that are inverted from each other, and the signals S21DP and S21DN are signals that are inverted from each other, and therefore, the output signal S22C of the multiplexer 22C and the output signal S22D of the multiplexer 22D are signals that are inverted from each other.

On the basis of a signal Ssel, the selector 23A selects the signal S22A in a case where the operation mode is the operation mode MA (single-phase mode) or the signal S22D in a case where the operation mode is the operation mode MB (differential mode), and outputs the selected signal as a signal S23A.

On the basis of a signal Ssel, the selector 23B selects the signal S22B in a case where the operation mode is the operation mode MA or the signal S22C in a case where the operation mode is the operation mode MB, and outputs the selected signal as a signal S23B.

On the basis of a signal Ssel, the selector 23C selects the signal S22C in a case where the operation mode is the operation mode MA or the signal S22B in a case where the operation mode is the operation mode MB, and outputs the selected signal as a signal S23C.

On the basis of a signal Ssel, the selector 23D selects the signal S22D in a case where the operation mode is the operation mode MA or the signal S22A in a case where the operation mode is the operation mode MB, and outputs the selected signal as a signal S23D.

The driver 24A sets a voltage at the output terminal Tout1 on the basis of the signals S22A, S22B, S23A, and S23B and a signal CTL. The driver 24B sets a voltage at the output terminal Tout2 on the basis of the signals S23C, S23D, S22C, and S22D and a signal CTL.

The driver 24A includes M-number of sub-drivers AA and N-number of sub-drivers AB. The driver 24B includes M-number of sub-drivers BA and N-number of sub-drivers BB. The numbers "M" and "N" are configured to be able to be changed by the signal CTL.

The sub-drivers AA, AB, BA, and BB each include resistors and transistors. The transistors are each an N-ch MOSFET. It is to be noted that in FIG. 38, the transistors are depicted in the drivers 24A and 24B. Further, in FIG. 38, an illustration of the resistors is omitted.

With this configuration, for example, in a case where in the operation mode MA (single-phase mode), the signal S22A is set to high level, and the signal S22B is set to low level, the signal S23A becomes high level, and the signal S23B becomes low level. As a result, the driver 24A is able to set the voltage at the output terminal Tout1 to high-level voltage VH and the output impedance to about 50[Ω], for example.

Further, for example, in a case where in the operation mode MA, the signal S22B is set to high level, and the signal S22A is set to low level, the signal S23B becomes high level, and the signal S23A becomes low level. As a result, the driver 24A is able to set the voltage at the output terminal Tout1 to low-level voltage VL and the output impedance to about 50[Ω], for example.

Further, for example, in a case where in the operation mode MB (differential mode), the signals S22A and S22D are both set to high level, and the signals S22B and S22C are both set to low level, the signals S23A and S23D both become high level, and the signals S23B and S23C both become low level. As a result, the driver 24A is able to set the voltage at the output terminal Tout1 to high-level voltage VH and the output impedance to about 50[Ω], for example. Likewise, the driver 24B is able to set the voltage at the output terminal Tout2 to low-level voltage VL and the output impedance to about 50[Ω], for example.

Further, for example, in a case where in the operation mode MB, the signals S22B and S22C are both set to high level, and the signals S22A and S22D are both set to low level, the signals S23B and S23C both become high level, and the signals S23A and S23D both become low level. As a result, the driver 24A is able to set the voltage at the output terminal Tout1 to low-level voltage VL and the output impedance to about 50[Ω], for example. Likewise, the driver 24B is able to set the voltage at the output terminal Tout2 to high-level voltage VH and the output impedance to about 50[Ω], for example.

Further, for example, in a case where in the operation mode MB, the signals S22A and S22C are both set to high level, and the signals S22B and S22D are both set to low level, the signals S23B and S23D both become high level, and the signals S23A and S23C both become low level. As a result, the driver 24A is able to set the voltage at the output terminal Tout1 to a voltage (VH−ΔV), which is lower by a voltage ΔV than high-level voltage VH, and the output impedance to about 50[Ω], for example. Likewise, the driver 24B is able to set the voltage at the output terminal Tout2 to a voltage (VL+ΔV), which is higher by the voltage ΔV than low-level voltage VL, and the output impedance to about 50[Ω], for example.

Further, for example, in a case where in the operation mode MB, the signals S22B and S22D are both set to high level, and the signals S22A and S22C are both set to low level, the signals S23A and S23C both become high level, and the signals S23B and S23D both become low level. As a result, the driver 24A is able to set the voltage at the output terminal Tout1 to the voltage (VL+ΔV), which is higher by the voltage ΔV than low-level voltage VL, and the output impedance to about 50[Ω], for example. Likewise, the driver 24B is able to set the voltage at the output terminal Tout2 to the voltage (VH−ΔV), which is lower by the voltage ΔV than high-level voltage VH, and the output impedance to about 50[Ω], for example.

The voltage ΔV varies depending on "M" and "N". That is, for example, increasing "M" and reducing "N" make it possible to reduce the voltage ΔV. Furthermore, for example, reducing "M" and increasing "N" make it possible to increase the voltage ΔV.

The controller 25 generates the clock signals P0 to P7 and CLK and the signals Ssel and CTL on the basis of the mode signal Smode.

The timing adjustment circuits 160AA, 160AB, 160BA, and 160BB control, in the operation mode MB (differential mode), the input timings of the signals to be inputted to the drivers 24A and 24B on the basis of the timing setting signals Tset_AA, Tset_AB, Tset_BA, and Tset_BB, respectively, by technology similar to that of the transmission device according to the first embodiment. This makes it possible to suppress the common mode of the differential signal in the operation mode MB.

Other configurations, operations, and effects may be substantially similar to those of the transmission device according to the first embodiment.

4. Other Embodiments

The technology according to the present disclosure is not limited to the explanation of the above-described embodiments, and various modifications may be made.

Moreover, the present technology may have the following configurations.

According to the present technology having the following configurations, the set values of the timing setting signals for the respective plurality of timing adjustment circuits are configured to be changed to the values corresponding to the plurality of transition states of the possible signal levels of each of the plurality of output signals to be outputted from the driver circuit. This makes it possible to improve the communication performance.

(1)
A transmission device including:
a driver circuit that includes a plurality of output circuits each including a plurality of transistors, and outputs a plurality of output signals from the plurality of output circuits on a basis of a plurality of driver input signals being respectively inputted to the plurality of transistors, the plurality of output signals configuring a differential signal and having signal levels that are different from each other;
a plurality of timing adjustment circuits that each adjusts, on a basis of a timing setting signal, an input timing of corresponding one of the plurality of driver input signals to the driver circuit; and
a control circuit that changes a set value of the timing setting signal for each of the plurality of timing adjustment circuits to a value corresponding to a plurality of transition states of possible signal levels of each of the plurality of output signals to be outputted from the driver circuit.

(2)
The transmission device according to (1), in which
the timing setting signal include a rise timing setting signal and a fall timing setting signal,
each of the plurality of timing adjustment circuits is configured to adjust a rising timing and a falling timing of corresponding one of the plurality of driver input signals on the basis of the rise timing setting signal and the fall timing setting signal, and
the control circuit changes respective set values of the rise timing setting signal and the fall timing setting signal to values corresponding to the plurality of transition states.

(3)
The transmission device according to (1) or (2), in which
each of the plurality of timing adjustment circuits includes
a delay circuit that generates a plurality of delay signals obtained by delaying signals corresponding to the driver input signals, and
a selector circuit that selects any one delay signal out of the plurality of delay signals on a basis of the timing setting signal and outputs the one delay signal as the driver input signal.

(4)
The transmission device according to any one of (1) to (3), in which
the control circuit includes a state determination circuit changes set values of the timing setting signals to the values corresponding to the plurality of transition states on a basis of a plurality of first input signals corresponding to the plurality of output signals and a plurality of second input signals obtained by delaying the plurality of first input signals.

(5)
The transmission device according to (4), in which the control circuit further includes
a plurality of first synchronization circuits each of which delays corresponding one of the plurality of first input signals on a basis of a clock signal, and outputs the plurality of second input signals, and
a plurality of second synchronization circuits each of which delays corresponding one of the plurality of second input signals on the basis of the clock signal, and outputs a third input signal to each of the plurality of timing adjustment circuits.

(6)
The transmission device according to any one of (1) to (5), in which the differential signal has a differential signal level of four or more values.

(7)
An electronic apparatus including:
a transmission device that transmits a differential signal; and a reception device that receives the differential signal transmitted from the transmission device, wherein the transmission device includes a driver circuit that includes a plurality of output circuits each including a plurality of transistors, and outputs a plurality of output signals from the plurality of output circuits on a basis of a plurality of driver input signals being respectively inputted to the plurality of transistors, the plurality of output signals configuring the differential signal and having signal levels that are different from each other, a plurality of timing adjustment circuits that each adjusts, on a basis of a timing setting signal, an input timing of corresponding one of the plurality of driver input signals to the driver circuit, and a control circuit that changes a set value of the timing setting signal for each of the plurality of timing adjustment circuits to a value corresponding to a plurality of transition states of possible signal levels of each of the plurality of output signals to be outputted from the driver circuit.

(8)

The electronic apparatus according to (7), further including an antenna that receives a radio signal and outputs the radio signal to the reception device as a reception signal, in which the reception device transmits a timing control signal to the transmission device, the timing control signal controlling a set value of the timing setting signal in the transmission device in such a manner that a state of the reception signal from the antenna becomes a desired state.

(9)

The electronic apparatus according to (8), further including a transmission path that transmits the differential signal between the transmission device and the reception device, in which the reception device generates the timing control signal on a basis of a level of antenna coupled noise generated by radiation noise radiated from the transmission path being coupled to the antenna, or a state of radio sensitivity of the antenna.

(10)

The electronic apparatus according to (8) or (9), in which the transmission device is configured to change operation frequency of the transmission device on a basis of an operation control signal in such a manner that a state of the reception signal from the antenna becomes a desired state, and the reception device generates the operation control signal on a basis of a level of antenna coupled noise generated by radiation noise caused by an operation of the transmission device being coupled to the antenna, or a state of radio sensitivity of the antenna, and transmits the operation control signal to the transmission device.

It should be understood by those skilled in the art that various modifications, combinations, sub-combinations, and alterations may occur depending on design requirements and other factors insofar as they are within the scope of the appended claims or the equivalents thereof.

The invention claimed is:

1. A transmission device comprising:

a driver circuit that includes a plurality of output circuits each including a plurality of transistors, and outputs a plurality of output signals from the plurality of output circuits on a basis of a plurality of driver input signals being respectively inputted to the plurality of transistors, the plurality of output signals configuring a differential signal and having signal levels that are different from each other;

a plurality of timing adjustment circuits that each adjusts, on a basis of a timing setting signal, an input timing of corresponding one of the plurality of driver input signals to the driver circuit; and a control circuit that changes a set value of the timing setting signal for each of the plurality of timing adjustment circuits to a value corresponding to a plurality of transition states of possible signal levels of each of the plurality of output signals to be outputted from the driver circuit.

2. The transmission device according to claim 1, wherein the timing setting signal include a rise timing setting signal and a fall timing setting signal, each of the plurality of timing adjustment circuits is configured to adjust a rising timing and a falling timing of corresponding one of the plurality of driver input signals on the basis of the rise timing setting signal and the fall timing setting signal, and the control circuit changes respective set values of the rise timing setting signal and the fall timing setting signal to values corresponding to the plurality of transition states.

3. The transmission device according to claim 1, wherein each of the plurality of timing adjustment circuits includes a delay circuit that generates a plurality of delay signals obtained by delaying signals corresponding to the driver input signals, and a selector circuit that selects any one delay signal out of the plurality of delay signals on a basis of the timing setting signal and outputs the one delay signal as the driver input signal.

4. The transmission device according to claim 1, wherein the control circuit includes a state determination circuit changes set values of the timing setting signals to the values corresponding to the plurality of transition states on a basis of a plurality of first input signals corresponding to the plurality of output signals and a plurality of second input signals obtained by delaying the plurality of first input signals.

5. The transmission device according to claim 4, wherein the control circuit further includes a plurality of first synchronization circuits each of which delays corresponding one of the plurality of first input signals on a basis of a clock signal, and outputs the plurality of second input signals, and a plurality of second synchronization circuits each of which delays corresponding one of the plurality of second input signals on the basis of the clock signal, and outputs a third input signal to each of the plurality of timing adjustment circuits.

6. The transmission device according to claim 1, wherein the differential signal has a differential signal level of four or more values.

7. An electronic apparatus comprising:

a transmission device that transmits a differential signal; and a reception device that receives the differential signal transmitted from the transmission device, wherein the transmission device includes a driver circuit that includes a plurality of output circuits each including a plurality of transistors, and outputs a plurality of output signals from the plurality of output circuits on a basis of a plurality of driver input signals being respectively inputted to the plurality of transistors, the plurality of output signals configuring the differential signal and having signal levels that are different from each other,
a plurality of timing adjustment circuits that each adjusts, on a basis of a timing setting signal, an input timing of corresponding one of the plurality of driver input signals to the driver circuit, and
a control circuit that changes a set value of the timing setting signal for each of the plurality of timing adjustment circuits to a value corresponding to a plurality of transition states of possible signal levels of each of the plurality of output signals to be outputted from the driver circuit.

8. The electronic apparatus according to claim 7, further comprising an antenna that receives a radio signal and outputs the radio signal to the reception device as a reception signal, wherein
the reception device transmits a timing control signal to the transmission device, the timing control signal controlling the set value of the timing setting signal in the transmission device in such a manner that a state of the reception signal from the antenna becomes a desired state.

9. The electronic apparatus according to claim 8, further comprising a transmission line that transmits the differential signal between the transmission device and the reception device, wherein
the reception device generates the timing control signal on a basis of a level of antenna coupled noise generated by radiation noise radiated from the transmission line being coupled to the antenna, or a state of radio sensitivity of the antenna.

10. The electronic apparatus according to claim 8, wherein
the transmission device is configured to change operation frequency of the transmission device on a basis of an operation control signal in such a manner that a state of the reception signal from the antenna becomes a desired state, and
the reception device generates the operation control signal on a basis of a level of antenna coupled noise generated by radiation noise caused by an operation of the transmission device being coupled to the antenna, or a state of radio sensitivity of the antenna, and transmits the operation control signal to the transmission device.

* * * * *